United States Patent
Pasotti et al.

(10) Patent No.: US 12,211,582 B2
(45) Date of Patent: Jan. 28, 2025

(54) SIGNED AND BINARY WEIGHTED COMPUTATION FOR AN IN-MEMORY COMPUTATION SYSTEM

(71) Applicants: STMicroelectronics S.r.l., Agrate Brianza (IT); Alma Mater Studiorum—Universita' Di Bologna, Bologna (IT)

(72) Inventors: Marco Pasotti, Travaco' Siccomario (IT); Marcella Carissimi, Bergamo (IT); Alessio Antolini, Bologna (IT); Eleonora Franchi Scarselli, Bologna (IT); Antonio Gnudi, Bologna (IT); Andrea Lico, Polia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1 day.

(21) Appl. No.: 17/718,755

(22) Filed: Apr. 12, 2022

(65) Prior Publication Data
US 2023/0326499 A1    Oct. 12, 2023

(51) Int. Cl.
*G11C 7/10*       (2006.01)
*G11C 7/12*       (2006.01)
(Continued)

(52) U.S. Cl.
CPC .............. *G11C 7/1063* (2013.01); *G11C 7/12* (2013.01); *G11C 7/14* (2013.01); *G11C 7/16* (2013.01); *G11C 8/08* (2013.01)

(58) Field of Classification Search
CPC ........... G11C 7/1063; G11C 7/12; G11C 7/14; G11C 7/16; G11C 8/08
See application file for complete search history.

(56) References Cited

U.S. PATENT DOCUMENTS 9,269,427 B2 *   2/2016   Nagey ................. G11C 27/005
9,396,795 B1      7/2016   Jeloka et al.
(Continued)

FOREIGN PATENT DOCUMENTS

WO    2021137894 A1    7/2021
WO    2021158861 A1    8/2021

OTHER PUBLICATIONS

Biswas, et al: "CONV-SRAM: An Energy-Efficient SRAM With In-Memory Dot-Product Computation for Low-Power Convolutional Neural Networks," IEEE Journal of Solid-State Circuits 54, No. 1, Dec. 17, 2018, pp. 217-230.
(Continued)

*Primary Examiner* — Vanthu T Nguyen
(74) *Attorney, Agent, or Firm* — Crowe & Dunlevy LLC

(57) ABSTRACT

An in-memory computation (IMC) circuit includes a memory array formed by memory cells arranged in row-by-column matrix. Computational weights for an IMC operation are stored in the memory cells. Each column includes a bit line connected to the memory cells. A switching circuit is connected between each bit line and a corresponding column output. The switching circuit is controlled to turn on to generate the analog signal dependent on the computational weight and for a time duration controlled by the coefficient data signal. A column combining circuit combines (by addition and/or subtraction) and integrates analog signals at the column outputs of the biasing circuits. The addition/subtraction is dependent on one or more a sign of the coefficient data and a sign of the computational weight and may further implement a binary weighting function.

52 Claims, 21 Drawing Sheets

(51) Int. Cl.
*G11C 7/14* (2006.01)
*G11C 7/16* (2006.01)
*G11C 8/08* (2006.01)

(56) References Cited

U.S. PATENT DOCUMENTS

| | | | |
|---|---|---|---|
| 9,508,446 | B1 | 11/2016 | Chen et al. |
| 10,073,733 | B1 | 9/2018 | Jain et al. |
| 10,636,481 | B1 | 4/2020 | Chang et al. |
| 10,692,570 | B2 | 6/2020 | Al-Shamma |
| 10,831,446 | B2 | 11/2020 | Chen et al. |
| 10,943,652 | B2 | 3/2021 | Lu et al. |
| 11,043,259 | B2 | 6/2021 | Wentzlaff et al. |
| 11,061,646 | B2 | 7/2021 | Sumbul et al. |
| 11,132,176 | B2 * | 9/2021 | Hung ............... G11C 16/24 |
| 11,604,974 | B2 * | 3/2023 | Kouno ............... G06N 3/063 |
| 11,615,299 | B2 * | 3/2023 | Mochida ............ G06N 3/065 706/41 |
| 2018/0260696 | A1 | 9/2018 | Suda et al. |
| 2019/0279709 | A1 | 9/2019 | Lee |
| 2021/0033648 | A1 | 2/2021 | Khaddam-Aljameh et al. |
| 2021/0134343 | A1 | 5/2021 | Li et al. |
| 2021/0271597 | A1 | 9/2021 | Verma et al. |
| 2021/0279036 | A1 | 9/2021 | Li et al. |
| 2021/0334639 | A1 | 10/2021 | Tran |
| 2021/0342671 | A1 | 11/2021 | Hoang et al. |
| 2021/0343320 | A1 | 11/2021 | Horng et al. |
| 2022/0044099 | A1 | 2/2022 | Conte et al. |
| 2022/0068380 | A1 | 3/2022 | Carissimi et al. |

OTHER PUBLICATIONS

Chi, et al: "Prime: A Novel Processing-In-Memory Architecture for Neural Network Computation in ReRAM-Based Main Memory," ACM SIGARCH Computer Architecture News 44, No. 3, Jun. 18, 2016, pp. 27-39.

Mittal, Sparsh: "A Survey of ReRAM-Based Architectures for Processing-In-Memory and Neural Networks," Machine Learning and Knowledge Extractions 1, No. 1, Mar. 2019, pp. 75-114.

Khaddam-Aljameh R et al: "Hermes Core—A 14nm CMOS and PCM-Based in Memory Compute Core Using an Array of 300PS/LSB Linearized CCO-Based Adcs and Local Digital Processing", 2021 Symposium on VLSI Circuits Digest of Technocal Papers, 3 pgs.

Mayahinia Mahta et al: "A Voltage-Controlled, Oscillation-Based ADC Design for Computation-in-Memory Architectures Using Emerging ReRAMs," ACM Journal on Emerging Technologies in Computing Systems, vol. 18, No. 2, Article 32, Pub date Mar. 2022, 26 pgs.

Zhang Xueyong et al: "A 0.11-0.38 pJ/cycle Differential Ring Oscillator in 65 nm CMOS for Robust Neurocomputing," IEEE Transactions on Circuits and Systems—I: Regular Papers, vol. 68, No. 2, Feb. 2021, 15 pgs.

* cited by examiner

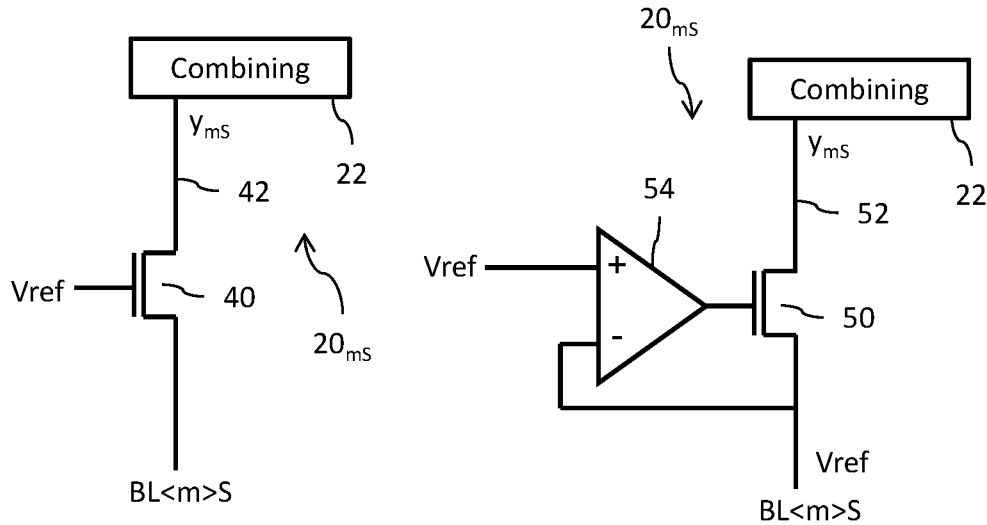
FIG. 2B-S    FIG. 2C-S
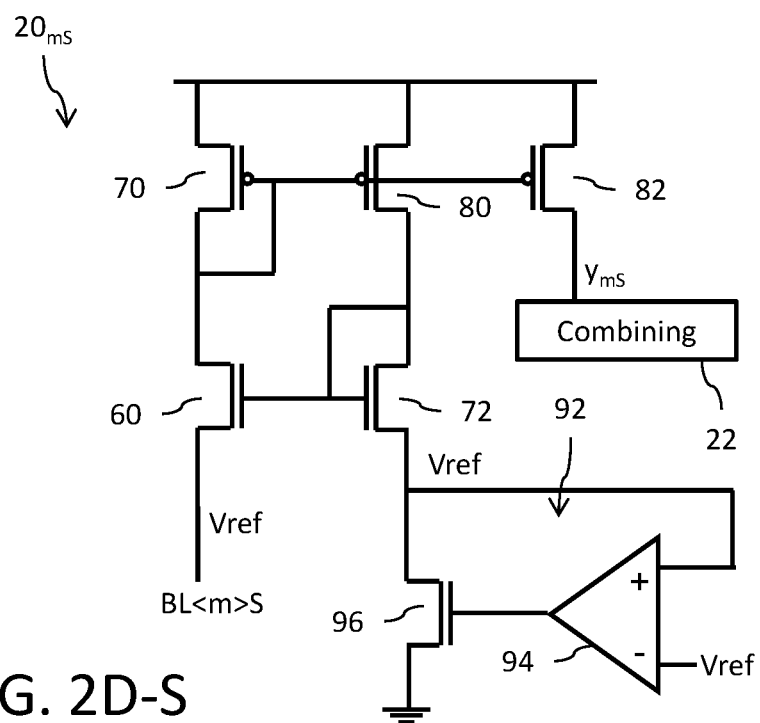
FIG. 2D-S

US 12,211,582 B2

SIGNED AND BINARY WEIGHTED COMPUTATION FOR AN IN-MEMORY COMPUTATION SYSTEM

TECHNICAL FIELD

Embodiments relate to an in-memory computation circuit and, in particular, to supporting signed and binary computation operations.

BACKGROUND

An in-memory computation (IMC) system stores information in the bit cells of a memory array and performs calculations at the bit cell level. An example of a calculation performed by an IMC system is a multiply and accumulate (MAC) operation where an input array of numbers (x values, also referred to as the feature or coefficient data) are multiplied by an array of computational weights (g values) stored in the memory and the products are added together to produce an output (z values).

$$\begin{bmatrix} z_1 \\ z_2 \\ \vdots \\ z_n \end{bmatrix} = \begin{bmatrix} g_{11} & g_{21} & \cdots & g_{m1} \\ g_{12} & g_{22} & \cdots & g_{m2} \\ \vdots & \vdots & \vdots & \vdots \\ g_{1n} & g_{2n} & \cdots & g_{mn} \end{bmatrix} \times \begin{bmatrix} x_1 \\ x_2 \\ \vdots \\ x_m \end{bmatrix}$$

$$\begin{cases} z_1 = g_{11} \times x_1 + g_{21} \times x_2 + \ldots + g_{m1} \times x_m \\ z_2 = g_{12} \times x_1 + g_{22} \times x_2 + \ldots + g_{m2} \times x_m \\ \quad\vdots \\ z_n = g_{1n} \times x_1 + g_{2n} \times x_2 + \ldots + g_{mn} \times x_m \end{cases}$$

By performing these calculations at the bit cell level in the memory, the IMC system does not need to move data back and forth between a memory device and a computing device. Thus, the limitations associated with data transfer bandwidth between devices are obviated and the computation can be performed with lower power consumption.

It is recognized that either or both the input numbers (x values) for the feature or coefficient data and the computational weights (g values) may have a signed (i.e., positive or negative) value. There is a need in the art to provide an IMC system that can account for the sign of the values when performing the MAC operation.

It is further recognized that the computational weights (g values) may be binary weighted. There is a need in the art to provide an IMC system that can provide binary weighting for the MAC operation.

SUMMARY

In an embodiment, an in-memory computation circuit comprises: a memory array including a plurality of memory cells arranged in a matrix with plural rows and plural columns, the memory cells storing computational weights for an in-memory compute operation, each row including a word line connected to the memory cells of the row, and each column including a bit line connected to the memory cells of the column; a switching circuit for each bit line, each switching circuit coupled between the bit line and a column output and controlled to turn on for a time duration corresponding to coefficient data for said in-memory compute operation; wherein an analog signal at the column output is dependent on the coefficient data and computational weight; wherein at least one of the coefficient data and computational weight has a sign; and a column combining circuit configured to combine and integrate a positive version of said analog signal generated at the column output in response to the sign being positive and combine and integrate a negative version of said analog signal generated at the column output in response to the sign being negative.

In an embodiment, an in-memory computation circuit comprises: a memory array including a plurality of memory cells arranged in a matrix with plural rows and plural columns, wherein each memory cell includes a first bit-cell configured to store a positive computational weight and a second bit-cell configured to store a negative computational weight, each row including a word line connected to the first and second bit-cells for the memory cells of the row, and each column including a positive bit line connected to the first bit-cells of the column and a negative bit line connected to the first bit-cells of the column; a positive switching circuit for each positive bit line, each positive switching circuit coupled between the positive bit line and a positive column output and controlled to turn on for a time duration corresponding to coefficient data for said in-memory compute operation; wherein a positive analog signal at the positive column output is dependent on the coefficient data and positive computational weight of the first bit-cell; a negative switching circuit for each negative bit line, each negative switching circuit coupled between the negative bit line and a negative column output and controlled to turn on for said time duration corresponding to coefficient data for said in-memory compute operation; wherein a negative analog signal at the negative column output is dependent on the coefficient data and negative computational weight of the second bit-cell; and a column combining circuit configured to add and integrate the positive analog signal generated at the positive column output and subtract and integrate the negative analog signal generated at the negative column output.

In an embodiment, an in-memory computation circuit comprises: a memory array including a plurality of memory cells arranged in a matrix with plural rows and plural columns, wherein each memory cell includes a first bit-cell configured to store a computational weight and a second bit-cell configured to store a weight sign, each row including a word line connected to the first and second bit-cells for the memory cells of the row, and each column including a weight bit line connected to the first bit-cells of the column and a sign bit line connected to the first bit-cells of the column; a switching circuit for each weight bit line, each switching circuit coupled between the weight bit line and a weight column output and controlled to turn on for a time duration corresponding to coefficient data for said in-memory compute operation; wherein an analog signal at the weight column output is dependent on the coefficient data and computational weight; and a column combining circuit configured to add and integrate the analog signal generated at the weight column output in response to a signal on the sign bit line indicating a positive value for the weight sign and subtract and integrate the analog signal generated at the weight column output in response to a signal on the sign bit line indicating a negative value for the weight sign.

In an embodiment, an in-memory computation circuit comprises: a memory array including a plurality of memory cells arranged in a matrix with plural rows and plural columns, wherein each memory cell is configured to store a computational weight, each row including a word line connected to the memory cells of the row, and each column including a bit line connected to the memory cells of the column; a switching circuit for each bit line, each switching circuit coupled between the bit line and a column output and controlled to turn on for a time duration for said in-memory compute operation; wherein an analog signal at the column output is dependent on the coefficient data and computational weight; wherein the coefficient data comprises a coefficient sign and a coefficient value; wherein said time duration is controlled in response to the coefficient value; and a column combining circuit configured to add and integrate the analog signal generated at the column output in response to a positive value of the coefficient sign and subtract and integrate the analog signal generated at the column output in response to a negative value of the coefficient sign.

In an embodiment, an in-memory computation circuit comprises: a memory array including a first bank of a plurality of memory cells arranged in a matrix with plural rows and plural columns, wherein each memory cell of the first bank is configured to store a positive computational weight, and a second bank of a plurality of memory cells arranged in a matrix with plural rows and plural columns, wherein each memory cell of the second bank is configured to store a negative computational weight, each row including a word line connected to the memory cells of the first and second banks, and each column including a positive bit line connected to the memory cells of the column in the first bank and a negative bit line connected to the memory cells of the column in the second bank; a positive switching circuit for each positive bit line, each positive switching circuit coupled between the positive bit line and a positive column output and controlled to turn on for a time duration corresponding to coefficient data for said in-memory compute operation; wherein a positive analog signal at the positive column output is dependent on the coefficient data and positive computational weight of the first bit-cell; a negative switching circuit for each negative bit line, each negative switching circuit coupled between the negative bit line and a negative column output and controlled to turn on for said time duration corresponding to coefficient data for said in-memory compute operation; wherein a negative analog signal at the negative column output is dependent on the coefficient data and negative computational weight of the second bit-cell; and a column combining circuit configured to add and integrate the positive analog signal generated at the positive column output and subtract and integrate the negative analog signal generated at the negative column output.

BRIEF DESCRIPTION OF THE DRAWINGS

For a better understanding of the embodiments, reference will now be made by way of example only to the accompanying figures in which:

FIGS. 2B and 2B-S each show a circuit diagram for another embodiment of the biasing circuit;

FIGS. 2C and 2C-S each show a circuit diagram for further embodiment of the biasing circuit;

FIGS. 2D and 2D-S each show a circuit diagram for yet another embodiment of the biasing circuit;

FIGS. 4A-1 and 4A-2 each show an embodiment for a combining circuit;

FIGS. 4B-1 and 4B-2 each show another embodiment for the combining circuit;

FIGS. 6-1 and 6-2 each show an embodiment for a combining circuit used with the circuit of FIG. 5;

FIGS. 8-1 and 8-2 each show an embodiment for a combining circuit used with the circuit of FIG. 7;

FIGS. 10-1 and 10-2 each show an embodiment for a combining circuit used with the circuit of FIG. 9;

FIGS. 12-1 and 12-2 show an embodiment for a combining circuit used with the circuit of FIG. 11.

DETAILED DESCRIPTION OF THE DRAWINGS

Figure 1:
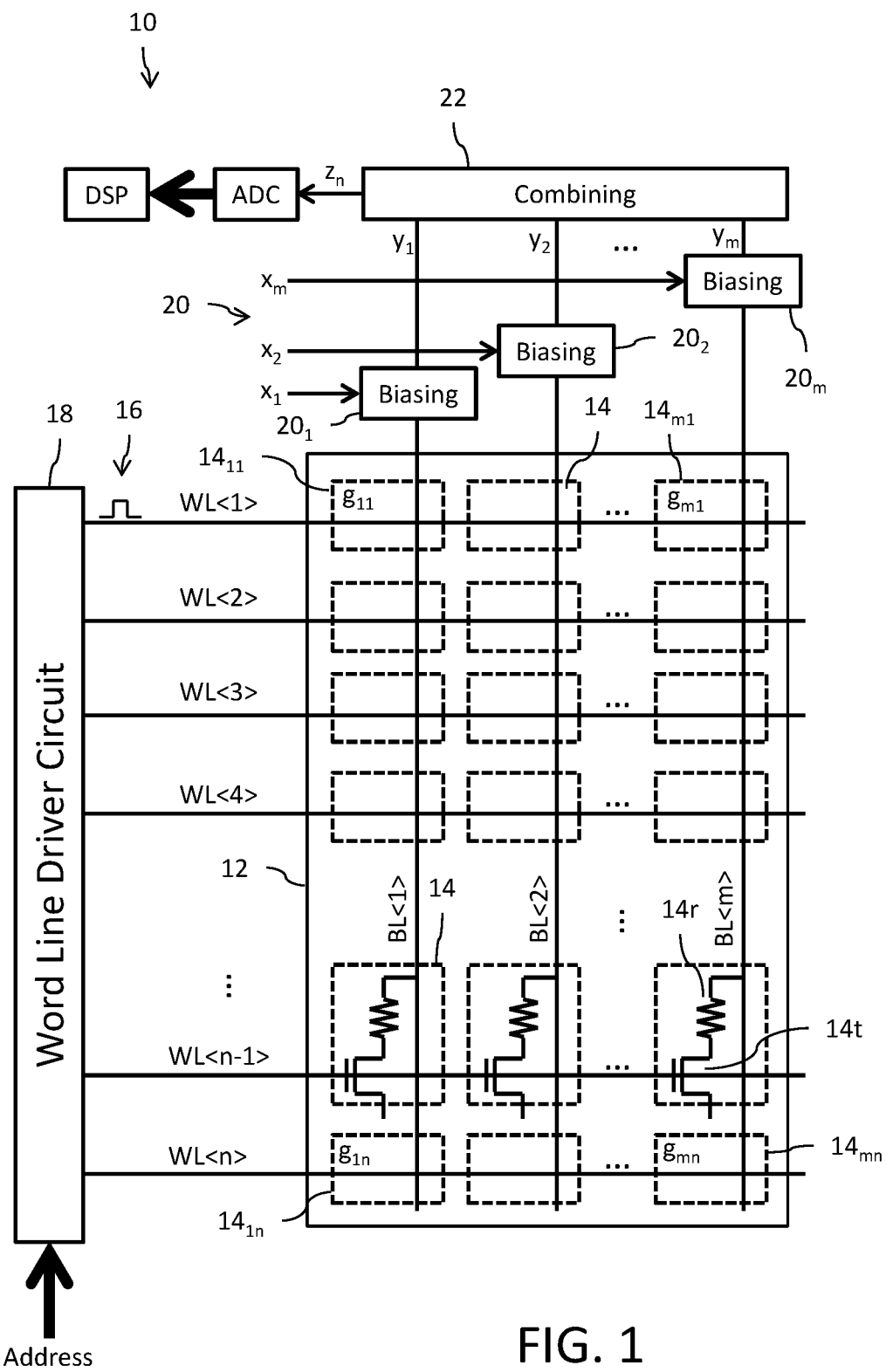
FIG. 1 is a schematic diagram of an embodiment for an in-memory computation circuit.

Reference is now made to FIG. 1 which shows a schematic diagram of an in-memory computation circuit 10. The circuit 10 utilizes a memory array 12 formed by a plurality of memory cells 14 arranged in a matrix format having m columns and n rows. Each memory cell 14 is programmed to store data $g_{mn}$ relating to the computational weights for an in-memory compute operation.

Each memory cell 14 includes a word line WL and a bit line BL. The memory cells 14 in a common row of the matrix are connected to each other through a common word line WL<n>. The memory cells 14 in a common column of the matrix are connected to each other through a common bit line BL<m>.

The word lines WL<1>, ..., WL<n> are driven by a word line driver circuit 18 which generates word line signals 16 in response to a received address signal (Address). The word line driver circuit 18 decodes the Address and applies the pulse of the word line signal 16 to one word line WL at a time (illustrated here, as an example, as being applied to word line WL<1>). The pulse width of each word line signal 16 is fixed and defined by an on time $T_{ON}$.

It is important to note here that the activation of one word line WL at a time performs a single multiply and accumulate (MAC) operation. In order to perform matrix-vector multiplication (MVM), where k MAC operations are implemented (k being less than or equal to n), a sequence of k word line WL activations are required. Consequently, k word line WL on time (Ton) cycles are necessary for the performance of one full MVM operation.

Biasing circuitry 20 applies a bias (time, voltage and/or current) to each of the bit lines BL in response to feature (or coefficient) data x input to the in-memory computation circuit 10. This feature data may, for example, comprise a plurality of multi-bit digital signals $x_1, \ldots, x_m$ that are processed by the biasing circuits $20_1, \ldots, 20_m$ to generate the bias applied to the corresponding word lines WL<1>, ..., WL<n>. The analog signal $y_m$ at a column output on a given bit line BL<m> (i.e., the bit line charge) is then dependent on a product between the bias applied to the bit line and the transconductance $g_{mn}$ (which corresponds to the programmed resistivity) of the memory cell $14_{mn}$ selected by the word line WL to which the word line signal 16 is applied. In other words, the memory cell 14 contributes a bit line current for the analog signal $y_m$ that is proportional to $x_m \times g_{mn}$. So, in the example shown in FIG. 1 where the word line signal 16 is applied to word line WL<1>, the analog signal $y_1$ charge on bit line BL<1> is proportional to $x_1 \times g_{11}$, the analog signal $y_2$ charge on bit line BL<2> is proportional to $x_2 \times g_{21}$, and the analog signal $y_m$ charge on bit line BL<m> is proportional to $x_m \times g_{m1}$.

A combining circuit 22 combines, for example through an integration operation, the analog signal $y_1, \ldots, y_m$ charges to generate a corresponding decision $z_n$ result for the MAC decision operation, where $z_n = g_{1n} \times x_1 + g_{2n} \times x_2 + \ldots + g_{mn} \times x_m$. Further processing of the decision $z_n$ result may, for example, be made by converting the analog decision signal $z_n$ to a digital value using an analog-to-digital converter (ADC) which is then processed in a digital signal processing (DSP) circuit.

In a preferred embodiment, each memory cell 14 is a phase change memory (PCM) cell comprising a select circuit (MOSFET transistor, BJT transistor, diode device, etc.) 14t operating as a switching element and a variable resistive element 14r providing the transconductance $g_{mn}$.

In case of a MOSFET transistor for the select circuit 14t (as shown in FIG. 1), the control node (gate) of the MOSFET transistor is connected to the word line WL. The source-drain path of the MOSFET transistor is connected in series with the variable resistive element 14r between the bit line BL and a reference node (for example, a source line or ground). More specifically, a drain of the MOSFET transistor is connected to a first terminal of the variable resistive element 14r, the source of the MOSFET transistor is connected to the reference node, and the second terminal of the variable resistive element 14r is connected to the bit line BL.

In case of a BJT transistor for the select circuit 14t, the control node (base) of the BJT transistor is connected to the word line WL. The conduction path of the BJT transistor is connected in series with the variable resistive element 14r between the bit line BL and a reference node (for example, ground). More specifically, the emitter of the BJT transistor is connected to a first terminal of the variable resistive element 14r, the collector of the BJT transistor is connected to the reference node (for example, ground), and the second terminal of the variable resistive element 14r is connected to the bit line BL. In this case the WL driver has the opposite polarity respect to the MOS select transistor case.

In case of a diode device for the select circuit 14t, the control node of the select device 14t is connected to the word line WL. The diode path of the select circuit 14t is connected in series with the variable resistive element 14r between the bit line BL and the word line. More specifically, one terminal of the diode device is connected to a first terminal of the variable resistive element 14r, the other is connected to the word line, and the second terminal of the variable resistive element 14r is connected to the bit line BL.

As is well known to those skilled in the art, a PCM-type memory cell 14 is configured to store data using phase change materials (such as chalcogenide) that are capable of stably transitioning between amorphous and crystalline phases according to an amount of heat transferred thereto. The amorphous and crystalline phases exhibit two or more distinct resistances (corresponding to the variable resistive element 14r), in other words two or more distinct transconductances, which are used to distinguish two or more distinct logic states programmable into the memory cell. The amorphous phase exhibits a relatively higher resistance (i.e., a lower transconductance) and thus the current sunk from the bit line BL by the memory cell programmed in this state when selected by assertion of the word line signal at the gate of the select circuit 14t is relatively smaller. Conversely, the crystalline phase exhibits a relatively lower resistance (i.e., a higher transconductance) and thus the current sunk from the bit line BL by the memory cell programmed in this state when selected by assertion of the word line signal at the gate of the select circuit 14t is relatively larger.

In an embodiment for a specific, but non-limiting, example for two distinct logic states: the amorphous phase may represent programming of the memory cell to logic "0" (or reset state) for the associated coefficient weight and the crystalline phase may represent programming of the memory cell to logic "1" (or set state) for the associated coefficient weight. In an embodiment for a three or more distinct logic states: varying degrees of the amorphous phase (with different resistances) plus the crystalline phase may be used to represent programming of the memory cell into three or more corresponding levels.

It will be understood that other memory cell types could instead be used for the array 12. For example, magnetoresistive random access memory (MRAM) cells or resistive random access memory (RRAM) cells could be used. The memory cell may alternatively comprise a static random access memory (SRAM) cell.

Figure 2A:
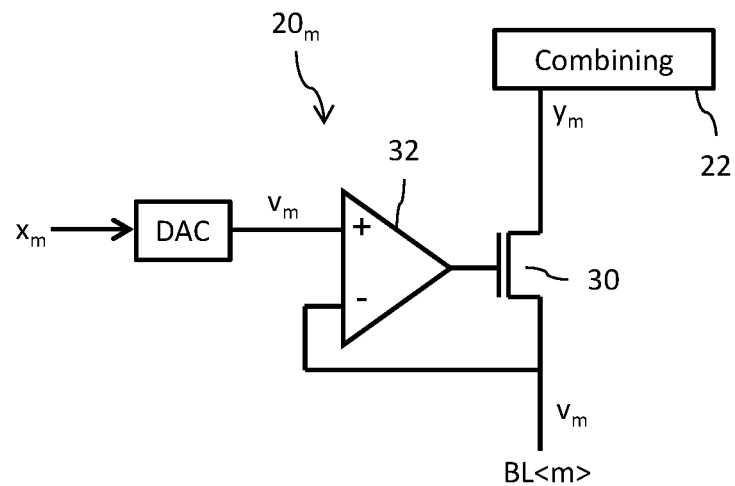
FIG. 2A shows a circuit diagram for an embodiment of a biasing circuit.

Reference is now made to FIG. 2A which shows an embodiment for the biasing circuits $20_1, \ldots, 20_m$. A metal oxide semiconductor field effect transistor (MOSFET) device 30 has its source-drain path coupled, preferably connected, in series with the bit line BL<m>. More specifically, the source terminal of the transistor 30 is connected to the bit line and the drain terminal that outputs the analog signal $y_m$ and is connected at a column output to the combining circuit 22. A differential amplifier circuit 32 has an inverting input terminal coupled, preferably directly connected, to the source terminal of transistor 30. An output of the amplifier circuit 32 is coupled, preferably directly connected, to the gate terminal of the transistor 30. The non-inverting input terminal of the amplifier 32 receives a voltage $v_m$ generated by a digital-to-analog converter (DAC) from a conversion of the feature (or coefficient) data $x_m$. The negative feedback with the transistor 30 and amplifier 32 forces the drain voltage (i.e., the bit line BL<m> voltage) to equal the voltage $v_m$ corresponding to the feature (or coefficient) data $x_m$. The bit line current for the analog signal $y_m$ is accordingly dependent on the product of bias voltage $v_m$ and the transconductance $g_{mn}$ (programmed resistivity) of the selected memory cell $14_{mn}$.

Figure 2B:
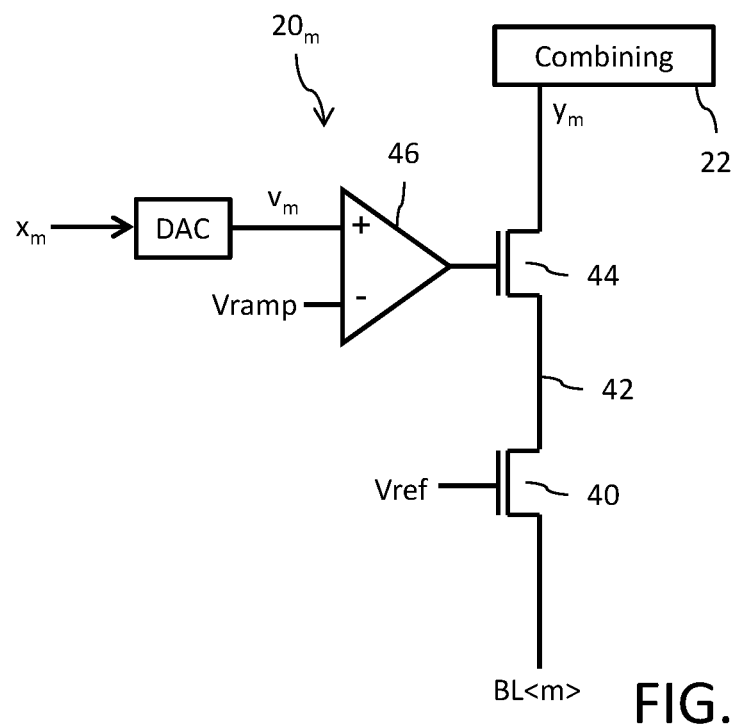
Figure 2C:
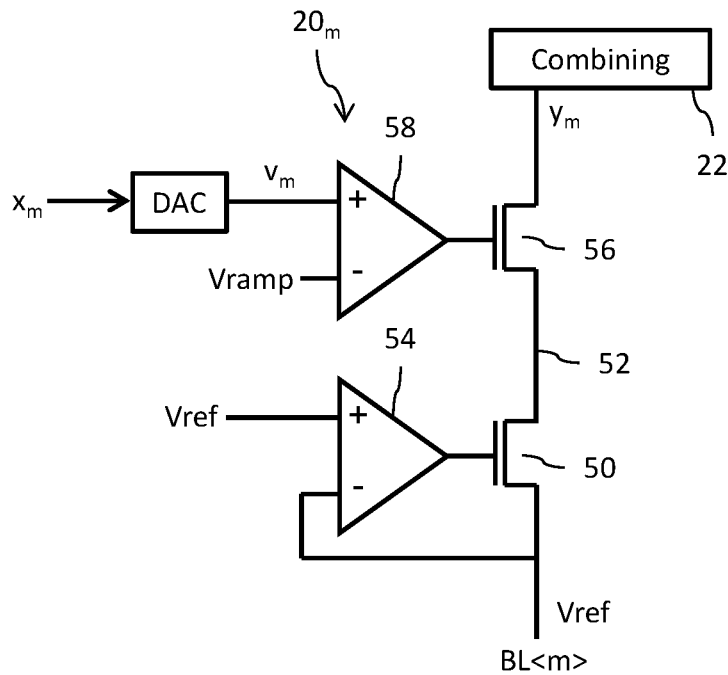
Figure 2D:
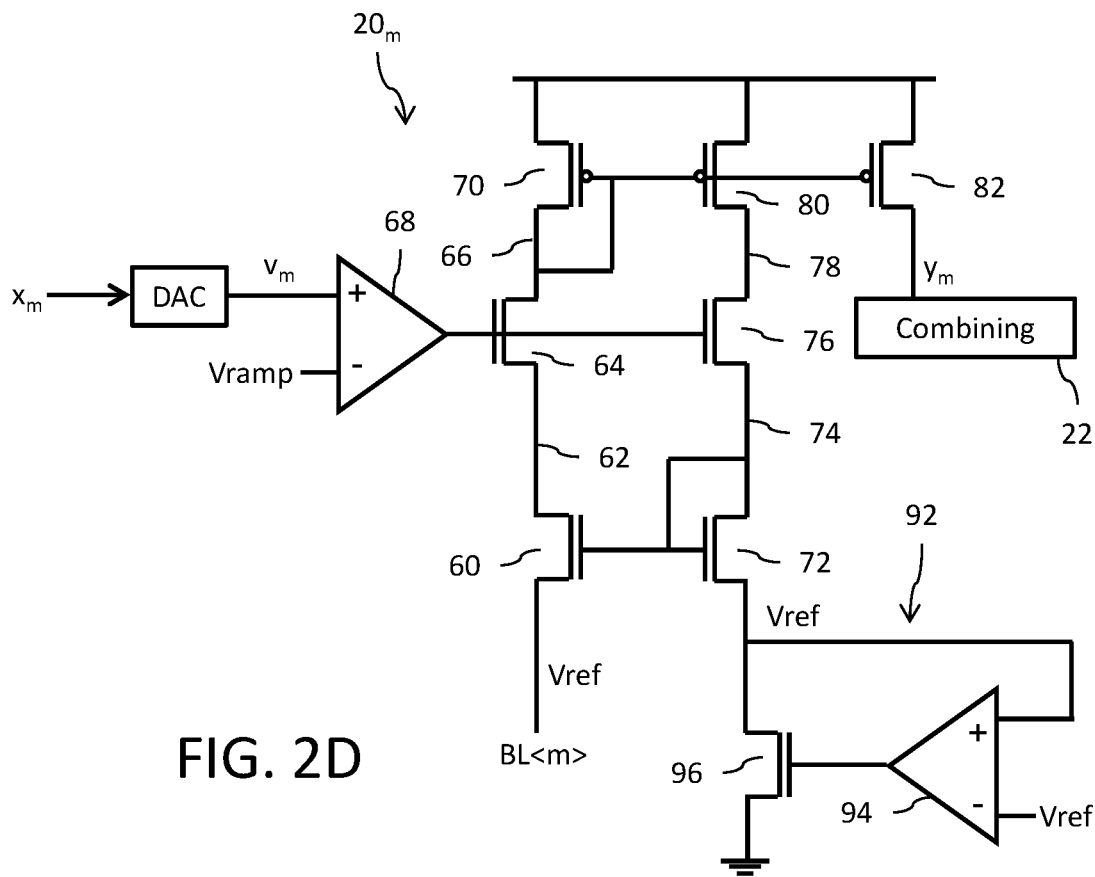

Those skilled in the art will understand that memory cells based on devices like phase change memory cells do not act as ideal resistances. The actual value of transconductance depends on the bit line BL voltage $V_{BL}$, and thus the transconductance $g_{mn}$ is a function of voltage $V_{BL}$. This relationship is referred to as a "non-linearity effect." For this reason, the circuit of FIG. 2A is not fully suitable for use in an in-memory computing application. The reason for this is that input is directly coupled to the bit line BL voltage, and thus the readout current would equal $g_{mn}(v_m) \cdot v_m$. Circuits to both keep the bit line voltage constant and to perform the multiplication necessary for in-memory computing are needed. The problem is solved with the circuits shown in FIGS. 2B, 2C and 2D. In this context, the biasing circuit of FIG. 2B provides an approximate solution, and the biasing circuits of FIGS. 2C and 2D provide more accurate solutions. The circuits of FIGS. 2C and 2D support reading of the memory cells at a fixed reference voltage level Vref, and this obviates concerns with the non-linearity effect.

FIG. 2B shows an alternative embodiment for the biasing circuits $20_1, \ldots, 20_m$. A MOSFET device 40 has its source-drain path coupled, preferably connected, in series with the bit line BL<m>. More specifically, the source terminal of the transistor 40 is connected to the bit line and the drain terminal is connected to an intermediate node 42. The gate terminal of the transistor 40 is biased by a reference voltage Vref (generated, for example, using a band gap or voltage regulator circuit). Transistor 40 functions as a voltage regulator to bias the bit line BL<m> with a voltage that is a function of on the reference voltage Vref and a term that is dependent on the bit line bias current (which can be made negligible with proper sizing of transistor 40 in a manner understood by those skilled in the art). A further MOSFET device 44 has its source-drain path coupled, preferably connected, in series with the transistor 40. More specifically, the source terminal of the transistor 44 is connected to the intermediate node 42 and the drain terminal that outputs the analog signal $y_m$ and is connected at a column output to the combining circuit 22. Transistor 44 functions as a switching element. A comparator circuit 46 has an inverting input terminal coupled, preferably directly connected, to receive a ramp signal Vramp. An output of the comparator circuit 46 is coupled, preferably directly connected, to the gate terminal of the transistor 44 to control the switching function. The non-inverting input terminal of the comparator 46 receives a voltage $v_m$ generated by a digital-to-analog converter (DAC) from a conversion of the feature (or coefficient) data $x_m$. The comparator 46 functions to compare the voltage $v_m$ to the ramp signal Vramp. When the voltage $v_m$ is less than the voltage of the ramp signal Vramp, the output of comparator 46 causes transistor 44 to turn on and the bit line biasing current is applied to the selected memory cell $14_{mn}$. When the voltage of the ramp signal Vramp exceeds the voltage $v_m$, comparator 46 turns off transistor 44. The duration of time for bit line current flow for the analog signal $y_m$ is accordingly dependent on the bias voltage $v_m$ while the BL current is proportional to the transconductance $g_{mn}$ (programmed resistivity) of the selected memory cell $14_{mn}$. The analog signal $y_m$ is accordingly dependent on the product of bias voltage $v_m$ and the transconductance $g_{mn}$ (programmed resistivity) of the selected memory cell $14_{mn}$. It will be noted here that the analog signal $y_m$ is a charge.

FIG. 2C shows a further embodiment for the biasing circuits $20_1, \ldots, 20_m$. A metal oxide semiconductor field effect transistor (MOSFET) device 50 has its source-drain path coupled, preferably connected, in series with the bit line BL<m>. More specifically, the source terminal of the transistor 50 is connected to the bit line and the drain terminal is connected to intermediate node 52. A differential amplifier circuit 54 has an inverting input terminal coupled, preferably directly connected, to the source terminal of transistor 50. An output of the amplifier circuit 54 is coupled, preferably directly connected, to the gate terminal of the transistor 50. The non-inverting input terminal of the amplifier 54 receives a reference voltage Vref (generated, for example, using a voltage regulator circuit). The negative feedback with the transistor 50 and amplifier 54 provides a voltage regulator circuit function that forces the drain voltage (i.e., the bit line BL<m> voltage) to equal the reference voltage Vref. In other words, a fixed reference voltage level is applied to the bit line. A further MOSFET device 56 has its source-drain path coupled, preferably connected, in series with the transistor 50. More specifically, the source terminal of the transistor 56 is connected to the intermediate node 52 and the drain terminal that outputs the analog signal $y_m$ and is connected at a column output to the combining circuit 22. Transistor 56 functions as a switching element. A comparator circuit 58 has an inverting input terminal coupled, preferably directly connected, to receive a ramp signal Vramp. An output of the comparator circuit 58 is coupled, preferably directly connected, to the gate terminal of the transistor 56 to control the switching function. The non-inverting input terminal of the comparator 58 receives a voltage $v_m$ generated by a digital-to-analog converter (DAC) from a conversion of the feature (or coefficient) data $x_m$. The comparator 58 functions to compare the voltage $v_m$ to the ramp signal Vramp. When the voltage $v_m$ is less than the voltage of the ramp signal Vramp, the output of comparator 58 causes transistor 56 to turn on and connect the bit line current from the selected memory cell $14_{mn}$ to the combining circuit 22. When the voltage of the ramp signal Vramp exceeds the voltage $v_m$, comparator 58 turns off transistor 56. The duration of time for bit line current flow for the analog signal $y_m$ is accordingly dependent on the bias voltage $v_m$ while the BL charge is proportional to the transconductance $g_{mn}$ (programmed resistivity) of the selected memory cell $14_{mn}$. The analog signal $y_m$ is accordingly dependent on the product of bias voltage $v_m$ and the transconductance $g_{mn}$ (programmed resistivity) of the selected memory cell $14_{mn}$. It will be noted here that the analog signal $y_m$ is a charge.

FIG. 2D shows a further embodiment for the biasing circuits $20_1, \ldots, 20_m$. A metal oxide semiconductor field effect transistor (MOSFET) device 60 has its source-drain path coupled, preferably connected, in series with the bit line BL<m>. More specifically, the source terminal of the transistor 60 is connected to the bit line and the drain terminal is connected to intermediate node 62. A further MOSFET device 64 has its source-drain path coupled, preferably connected, in series with the transistor 60. More specifically, the source terminal of the transistor 64 is connected to the intermediate node 62 and the drain terminal is connected to intermediate node 66. Transistor 64 functions as a switching element. A comparator circuit 68 has an inverting input terminal that receives a ramp signal Vramp. An output of the comparator circuit 68 is coupled, preferably directly connected, to the gate terminal of the transistor 64 to control the switching function. The non-inverting input terminal of the comparator 68 receives a voltage $v_m$ generated by a digital-to-analog converter (DAC) from a conversion of the feature (or coefficient) data $x_m$. A MOSFET device 70 has its source-drain path coupled, preferably connected, in series with the transistor 64. More specifically, the drain terminal of the transistor 70 is connected to the intermediate node 66 and the source terminal is connected to a positive supply node. A MOSFET device 72 is connected to transistor 60 to form a current mirror circuit. The source terminal of transistor 72 is coupled to receive a reference voltage Vref. The gate and drain terminals of transistor 72 are coupled, preferably directly connected, together at intermediate node 74 and further coupled, preferably directly connected, to the gate terminal of transistor 60. A MOSFET device 76 has its source-drain path coupled, preferably connected, in series with the transistor 72. More specifically, the drain terminal of the transistor 76 is connected to the intermediate node 74 and the source terminal is connected to intermediate node 78. Transistor 76 functions as a switching element. The gate terminal of transistor 76 is coupled to the output of comparator 64 which controls its switching function. A MOSFET device 80 is connected to transistor 70 to form a current mirror circuit. The source terminal of transistor 80 is coupled, preferably directly connected, to the positive supply node and a drain terminal is coupled, preferably directly connected, to intermediate node 78. The gate and drain terminals of transistor 70 are coupled, preferably directly connected, together at intermediate node 66 and further coupled, preferably directly connected, to the gate terminal of transistor 80. This current mirror circuit further includes MOSFET device 82 whose gate terminal is coupled, preferably directly connected, to the gate terminals of transistors 70 and 80, whose source terminal is coupled, preferably directly connected, to the positive supply node and whose drain terminal outputs the analog signal $y_m$ and is connected at a column output to the combining circuit 22.

This circuit configuration with the two current mirrors provides a voltage feedback that functions to force the gate-to-source voltages of transistors 60 and 72 to be equal. Thus, with the reference voltage Vref applied to the source of transistor 72, that reference voltage Vref will also be applied to the bit line BL<m>. In other words, a fixed reference voltage level is applied to the bit line. In an embodiment, the current mirroring ratio between transistors 70 and 80 may, for example, be on the order of 10:1 in order to reduce current and limit total current consumption. A similar current mirroring ratio may be used between transistors 70 and 82.

The comparator 68 functions to compare the voltage $v_m$ to the ramp signal Vramp. When the voltage $v_m$ is less than the voltage of the ramp signal Vramp, the output of comparator 68 causes transistors 64 and 76 to turn on and activate the current mirror circuits. The bit line current from the selected memory cell $14_{mn}$ is mirrored through transistor 82 to the combining circuit 22. When the voltage of the ramp signal Vramp exceeds the voltage $v_m$, comparator 68 turns off transistors 64 and 76. The duration of time for bit line current for the analog signal $y_m$ is accordingly dependent on the bias voltage $v_m$ while the BL current is proportional to the transconductance $g_{mn}$ (programmed resistivity) of the selected memory cell $14_{mn}$. The analog signal $y_m$ is accordingly dependent on the product of bias voltage $v_m$ and the transconductance $g_{mn}$ (programmed resistivity) of the selected memory cell $14_{mn}$. It will be noted here that the analog signal $y_m$ is a charge.

The reference voltage Vref applied to the source terminal of transistor 72 may be generated using a voltage regulator circuit. For example, a low-drop out (LDO) type voltage regulator 92 formed by an amplifier 94 and MOSFET device 96, where the MOSFET device is coupled in series with transistor 72 and gate driven by the output of the amplifier. Feedback from the source of transistor 72 (drain of transistor 96) is provided to the non-inverting input of the amplifier, and the inverting input receives the reference voltage Vref which may be generated using a band-gap circuit. The voltage at the source of transistor 72 (drain of transistor 96) is regulated to equal the reference voltage Vref. The LDO type regulator 92 may be used as well for generating the reference voltage Vref for the circuit of FIG. 2B. It will also be understood that the LDO type regulator may be shared in parallel by multiple ones of the circuits $20_m$.

Figure 3A:
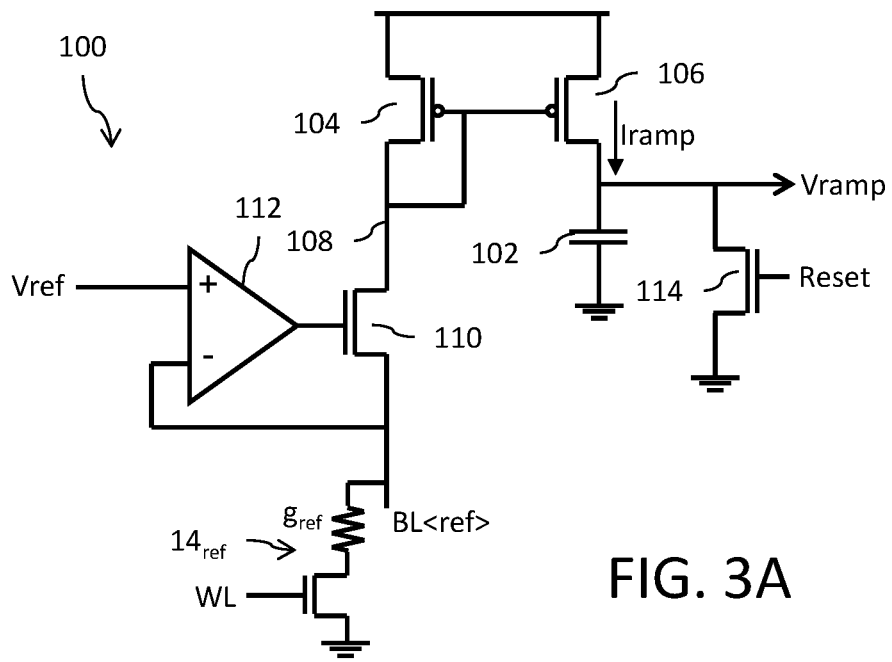
FIGS. 3A and 3B show embodiments for a ramp generator circuit.

Reference is now made to FIG. 3A which shows an embodiment for a ramp generator circuit 100 used to generate the ramp signal Vramp used in the biasing circuit $20_m$ shown in FIGS. 2B, 2C and 2D. The voltage for the ramp signal Vramp is generated across a capacitor 102 in response to a ramp current Tramp output by a current mirror circuit formed by MOSFET devices 104 and 106. The source terminals of transistors 104 and 106 are coupled, preferably directly connected, to the positive supply node. The drain terminal of transistor 106 is coupled, preferably directly connected, to a first terminal of the capacitor 102. A second terminal of the capacitor 102 is coupled, preferably directly connected, to ground. The drain terminal of transistor 104 is coupled, preferably directly connected, to the gate terminals of transistors 104 and 108 and also to intermediate node 108. A MOSFET device 110 has its source-drain path coupled, preferably directly connected, between intermediate node 108 and a reference bit line BL<ref>. A reference memory cell $14_{ref}$ is coupled, preferably directly connected, to the reference bit line BL<ref> and programmed with a reference transconductance $g_{ref}$. The reference memory cell $14_{ref}$ is selected by a word line signal concurrently with the word line actuation in the memory array. In a preferred implementation, the reference bit line BL<ref> with reference memory cell $14_{ref}$ is part of the memory array 12. It will also be noted that plural reference memory cells $14_{ref}$ may be coupled to the reference bit line BL<ref>.

A differential amplifier circuit 112 has an inverting input terminal coupled, preferably directly connected, to the source terminal of transistor 110. An output of the amplifier circuit 112 is coupled, preferably directly connected, to the gate terminal of the transistor 110. The non-inverting input terminal of the amplifier 112 receives a reference voltage Vref. The negative feedback with the transistor 110 and amplifier 112 forces the drain voltage (i.e., the bit line BL<ref> voltage) to equal the reference voltage Vref. Note here that this is analogous to circuits of FIGS. 2C and 2D for the bit line BL<m>. The bit line current flow from the reference memory cell $14_{ref}$ is mirrored by the current mirror circuit (transistors 104 and 106) to generate a current Iramp to charge the capacitor 102 and produce the ramp signal Vramp. A MOSFET device 114 connected in parallel with the capacitor 102 is selectively activated by reset signal (Reset) to discharge the capacitor 102 at the start of each cycle of the ramp signal Vramp. The advantage provided by use of the bit line current from the reference memory cell $14_{ref}$ is that the generation of the ramp signal Vramp will match any drift experienced with respect to the memory cells $14_{mn}$ of the memory 12.

Figure 3B:
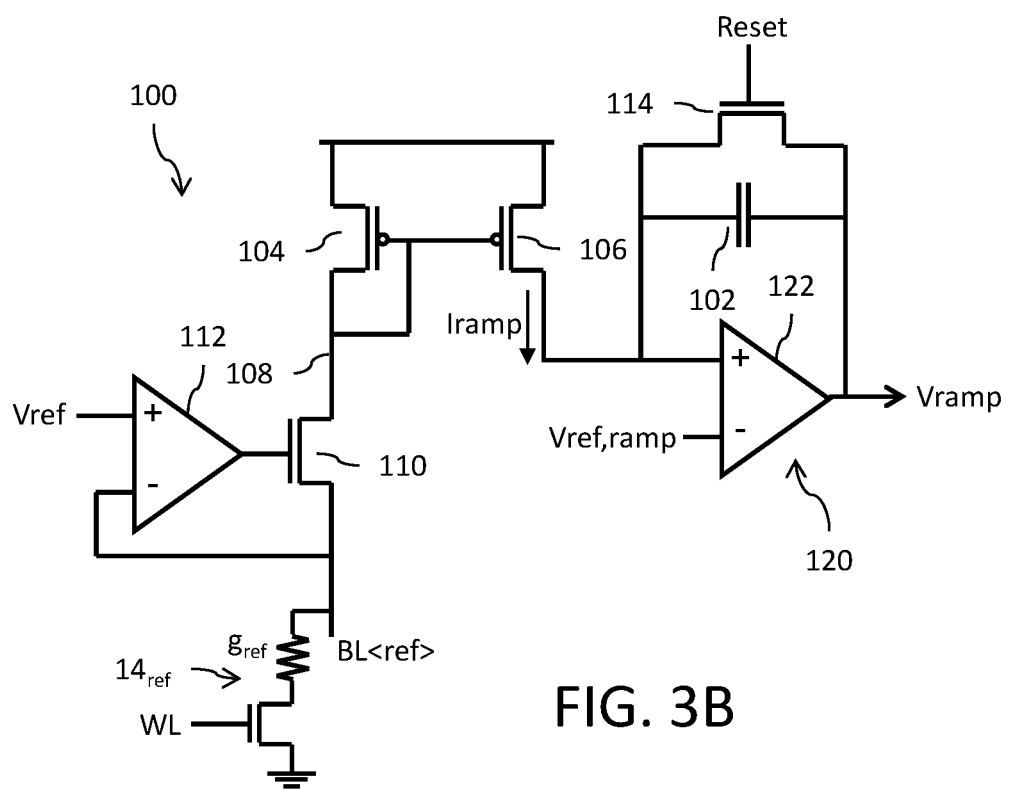

Reference is now made to FIG. 3B which shows an embodiment for a ramp generator circuit 100 used to generate the ramp signal Vramp used in the biasing circuit $20_m$ shown in FIGS. 2B, 2C and 2D. The voltage for the ramp signal Vramp is generated by an integrator circuit 120 across an integration capacitor 102 in response to a ramp current Tramp output by a current mirror circuit formed by MOSFET devices 104 and 106. The integrator circuit 120 includes a differential amplifier 122 having an inverting input terminal configured to receive a ramp reference voltage Vref,ramp. The integration capacitor 102 is coupled, preferably directly connected, in feedback between the output terminal of the amplifier 122 and the non-inverting input terminal. A MOSFET device 114 connected in parallel with the capacitor 102 is selectively activated by reset signal (Reset) to discharge the capacitor 102 at the start of each cycle of the ramp signal Vramp. The source terminals of transistors 104 and 106 for the current mirror circuit are coupled, preferably directly connected, to the positive supply node. The drain terminal of transistor 106 is coupled, preferably directly connected, to the non-inverting input terminal and the first terminal of the capacitor 102. The drain terminal of transistor 104 is coupled, preferably directly connected, to the gate terminals of transistors 104 and 108 and also to intermediate node 108. A MOSFET device 110 has its source-drain path coupled, preferably directly connected, between intermediate node 108 and a reference bit line BL<ref>. A reference memory cell $14_{ref}$ is coupled, preferably directly connected, to the reference bit line BL<ref> and programmed with a reference transconductance $g_{ref}$. The reference memory cell $14_{ref}$ is selected by a word line signal concurrently with the word line actuation in the memory array. In a preferred implementation, the reference bit line BL<ref> with reference memory cell $14_{ref}$ is part of the memory array 12. It will also be noted that plural reference memory cells 14$_{ref}$ may be coupled to the reference bit line BL<ref>.

A differential amplifier circuit 112 has an inverting input terminal coupled, preferably directly connected, to the source terminal of transistor 110. An output of the amplifier circuit 112 is coupled, preferably directly connected, to the gate terminal of the transistor 110. The non-inverting input terminal of the amplifier 112 receives a reference voltage Vref. The negative feedback with the transistor 110 and amplifier 112 forces the drain voltage (i.e., the bit line BL<ref> voltage) to equal the reference voltage Vref. Note here that this is analogous to circuits of FIGS. 2C and 2D for the bit line BL<m>. The bit line current from the reference memory cell 14$_{ref}$ is mirrored by the current mirror circuit (transistors 104 and 106) to generate a current Iramp that is integrated by the integration circuit 120 across the capacitor 102 to produce the ramp signal Vramp. The advantage provided by use of the bit line current from the reference memory cell 14$_{ref}$ is that the generation of the ramp signal Vramp will match any drift experienced with respect to the memory cells 14$_{mn}$ of the memory 12.

Figures 1, 4A:
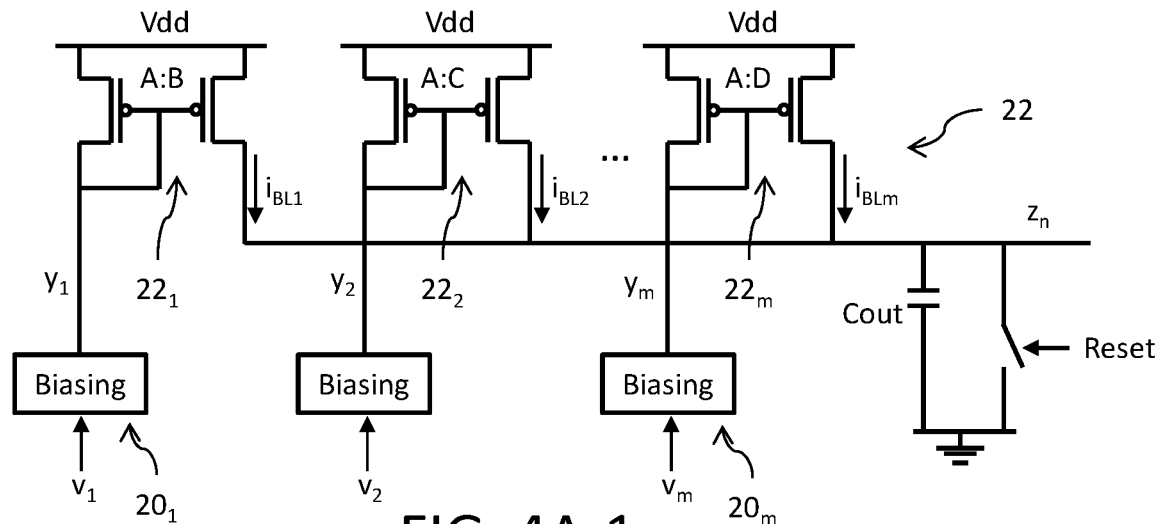
Figures 1, 4B:
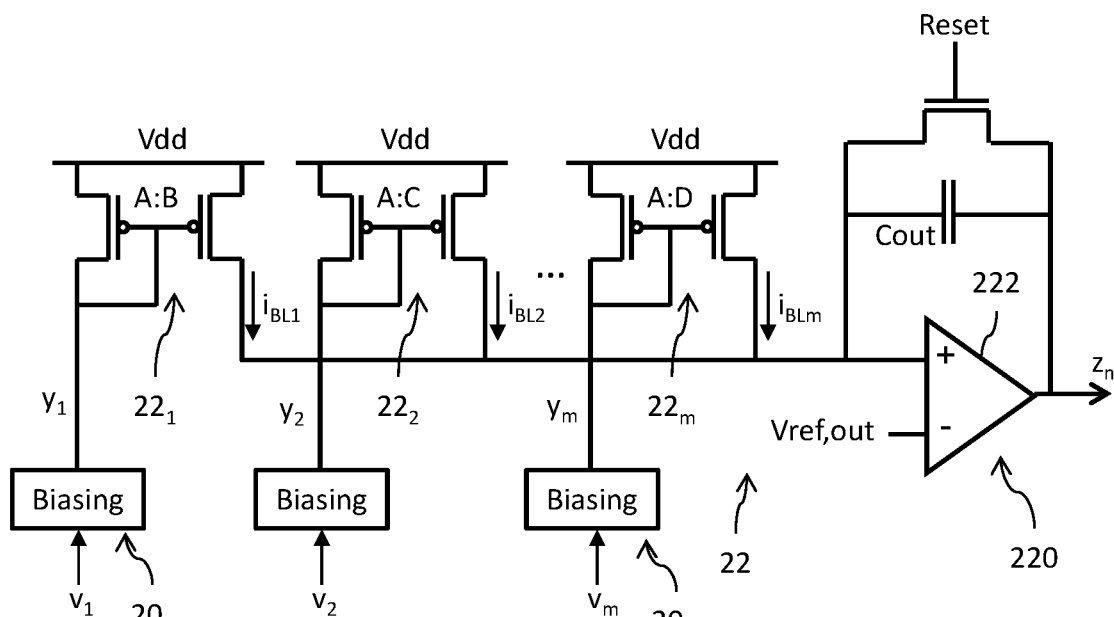
Figures 2, 4A:
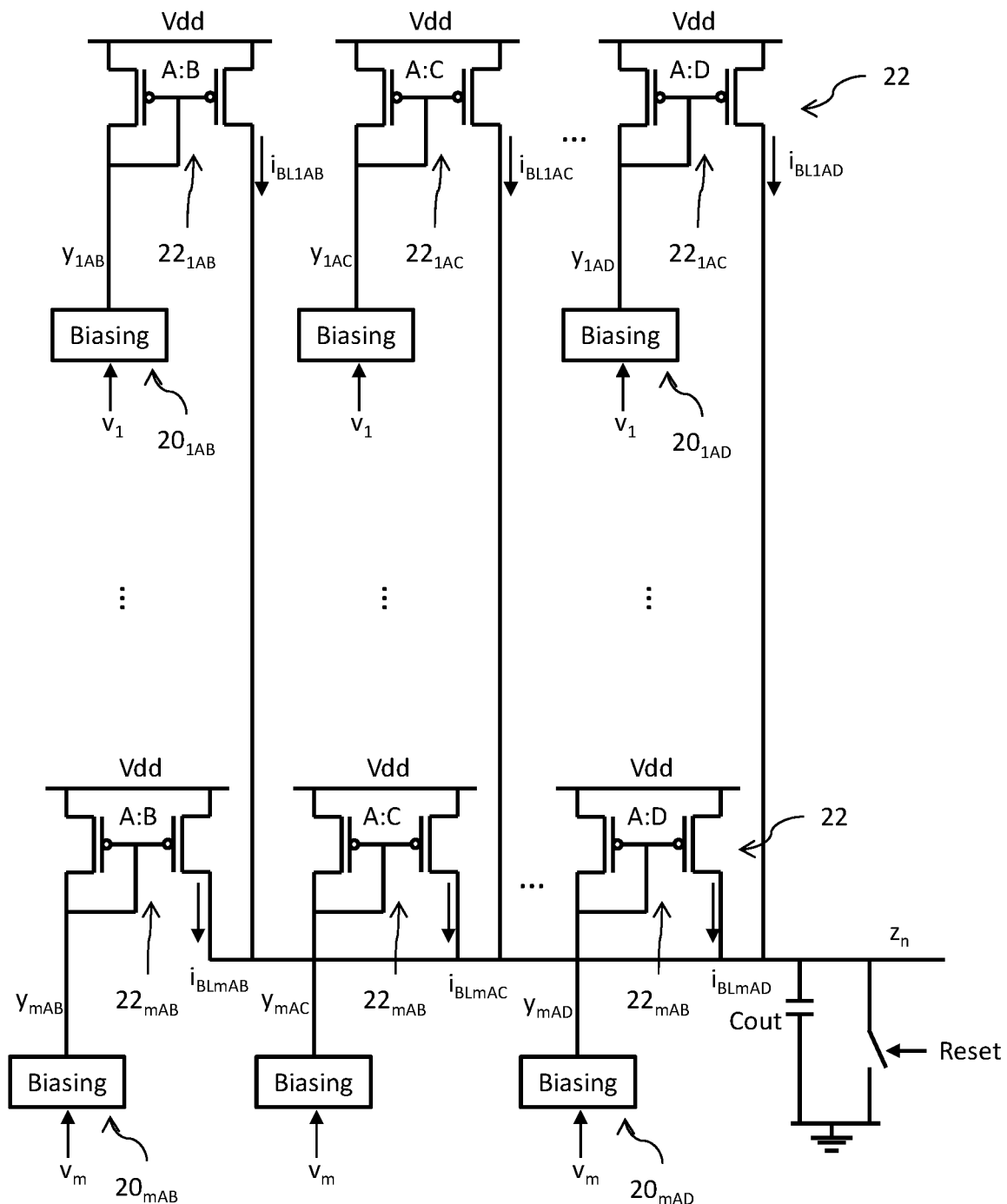
Figures 2, 4B:
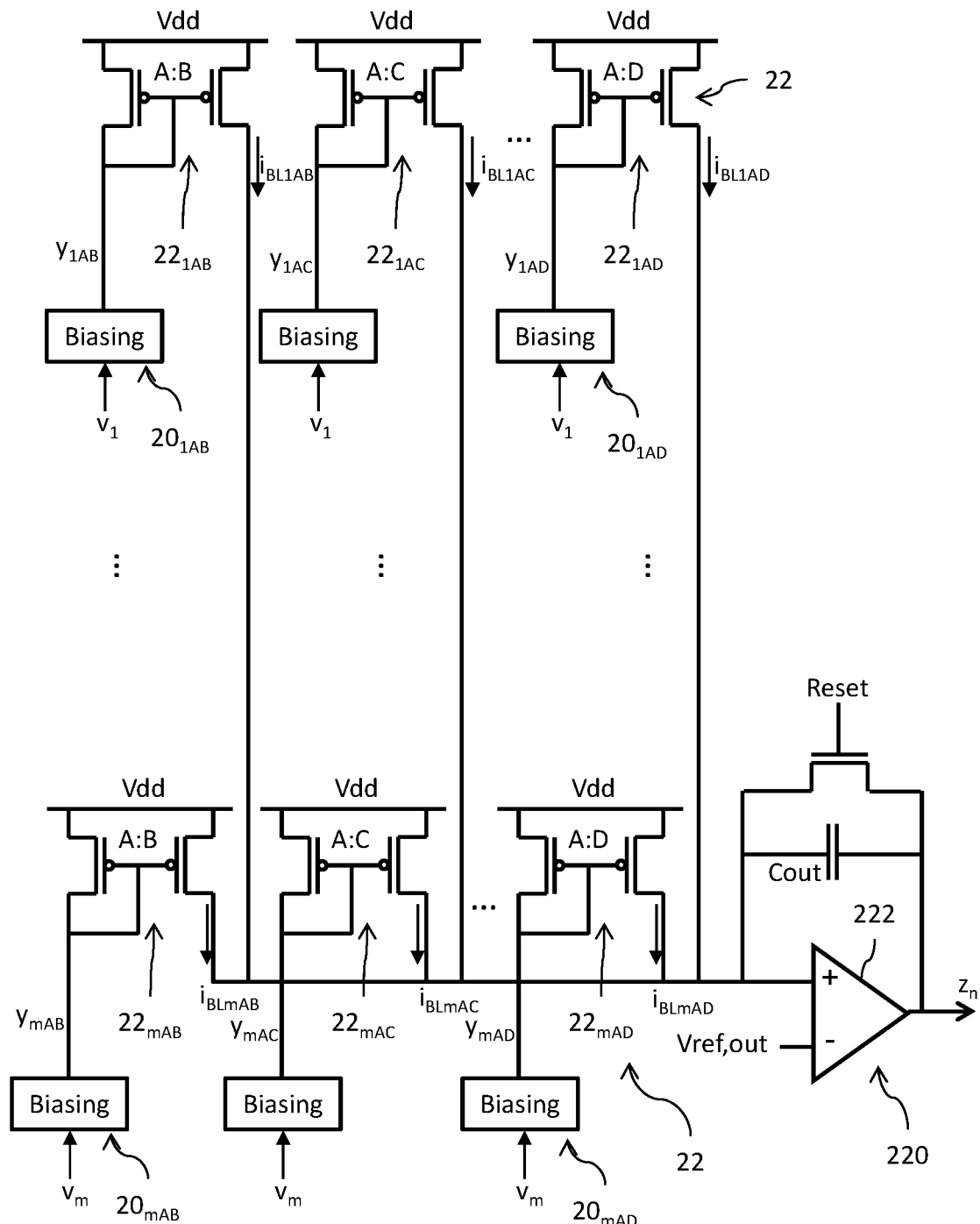

Reference is now made to FIGS. 4A-1 and 4A-2 which each show an embodiment for the combining circuit 22. The analog signal y$_m$ (y$_{mAB}$, y$_{mAC}$, y$_{mAD}$) is dependent on the bit line current from the memory cell 14$_{mn}$ at the column output which is mirrored by a current mirror circuit 22$_m$ (22$_{mAB}$, 22$_{mAC}$, 22$_{mAD}$) and sourced as current i$_{BLm}$ (i$_{BLmAB}$, i$_{BLmAC}$, i$_{BLmAD}$) to charge an output capacitor Cout across which is generated an output voltage for the decision z$_n$ result of the MAC decision operation. It is the sum of the currents i$_{BL1}$, ..., i$_{BLm}$ (i$_{BL1AB}$, ..., i$_{BLmAD}$) generated by the current mirror circuits 22$_1$, ..., 22$_m$ (22$_{1AB}$, ..., 22$_{mAD}$) that is integrated on the output capacitor Cout. A switch circuit, formed for example by a MOSFET device, is controlled the reset signal (Reset) to discharge the output capacitor Cout at the beginning of each MAC decision operation.

It is important to again note here that the activation of one word line WL at a time performs a single multiply and accumulate (MAC) operation. Each MAC operation needed for the in-memory computation, for examine in connection with performing matrix-vector multiplication (MVM), requires a different word line selection.

The MAC operation performed may be mathematically described as follows:

$$V_{OUT,n} = \sum_{i=1}^{m} \frac{Q_{OUT,i}}{C_{OUT}} = \frac{I_{BL,i} T_{ON,i}}{C_{OUT}} = \sum_{i=1}^{m} \frac{g_{i,n}(Vref, t) Vref}{C_{OUT}} \frac{v_i C_{RAMP}}{I_{RAMP}} =$$

$$\sum_{i=1}^{m} \frac{g_{i,n}(Vref, t) Vref}{C_{OUT}} \frac{v_i C_{RAMP}}{g_{ref}(Vref, t) Vref} = \frac{C_{RAMP}}{C_{OUT}} \sum_{i=1}^{m} \frac{g_{i,n}(Vref, t) v_i}{g_{ref}(Vref, t)}$$

Where: V$_{OUT,n}$, i.e., z$_n$, is the output voltage across the output capacitor Cout in response to the bit line currents from the memory cell transconductances g$_{1n}$ to g$_{mn}$, Q$_{OUT,i}$ is the corresponding charge contribution of BL<i>, where i=1, ..., m, COUT is the capacitance of the output capacitor Cout, i$_{BL,i}$ is the mirrored bit line current from the memory cell 14$_{in}$, T$_{ON,i}$ is the duration of time for bit line BL<i> current flow for the analog signal y$_i$, g$_{i,n}$ is the transconductance of the memory cell 14$_{i,n}$ corresponding to its programmed weight, Vref is the reference voltage, v$_i$ is the input voltage corresponding to the feature (or coefficient) data x$_i$, CRAMP is the capacitance of the ramp generator circuit capacitor 102, g$_{ref}$ is the transconductance of the reference memory cell 14$_{ref}$.

The foregoing mathematical representation is applicable to the use of the circuits shown in FIGS. 2B, 2C and 2D along with either of the circuits shown in FIGS. 4A-1, 4A-2, 4B-1 and 4B-2.

The use of the reference memory cell 14$_{ref}$ in connection with the generation of the ramp signal further supports removal of the weight time (drift) dependence. It is known in the art that the conductance of the memory cells 14 tends to decrease due to amorphization and relaxation of the crystal lattice for the phase change material. In particular, this conductance drift can be modeled and shaped by empirical law:

$$G(t) = G_0 \left(\frac{t}{t_0}\right)^{-\alpha}$$

Where: t is time, t$_0$ is an arbitrary time instant, $\alpha$ is the drift coefficient, and G$_0$ is the conductance at time t$_0$.

Considering the contribution of a single bit line BL current only, then the output voltage is given by:

$$V_{OUT,m} = \left(\frac{C_{RAMP}}{C_{OUT}} \frac{g_{mn}(t)}{g_{ref}(t)}\right) v_m =$$

$$\left(\frac{C_{RAMP}}{C_{OUT}} \frac{g_{mn}\left(\frac{t}{t_0}\right)^{-\alpha_{mn}}}{g_{ref}\left(\frac{t}{t_0}\right)^{-\alpha_{ref}}}\right) v_m = \left(\frac{C_{RAMP}}{C_{OUT}} \frac{g_{mn}}{g_{ref}} \left(\frac{t}{t_0}\right)^{-(\alpha_{mn} - \alpha_{ref})}\right) v_m$$

Considering now the whole MAC operation, where all BL currents are summed and integrated on the COUT capacitance:

$$V_{OUT,m} = \sum_{i=1}^{m} \left(\frac{C_{RAMP}}{C_{OUT}} \frac{g_{i,n}(t)}{g_{ref}(t)}\right) v_i =$$

$$\sum_{i=1}^{m} \left(\frac{C_{RAMP}}{C_{OUT}} \frac{g_{i,n}\left(\frac{t}{t_0}\right)^{-\alpha_{i,n}}}{g_{ref}\left(\frac{t}{t_0}\right)^{-\alpha_{ref}}}\right) v_i = \left(\frac{C_{RAMP}}{C_{OUT}} \sum_{i=1}^{m} \frac{g_{i,n} v_i}{g_{ref}} \left(\frac{t}{t_0}\right)^{-(\alpha_{i,n} - \alpha_{ref})}\right)$$

If $\alpha_{mn} \sim \alpha_{ref}$, meaning that the memory cells 14$_{mn}$ and the reference memory cell 14$_{ref}$ suffer from substantially the same drift, the drift coefficient is zero and drift is compensated for using the circuit.

Reference is now made to FIGS. 4B-1 and 4B-2 which each show another embodiment for the combining circuit 22. The analog signal y$_m$ is dependent on the bit line current from the memory cell 14$_{mn}$ at the column output which is mirrored by a current mirror circuit 22$_m$ (22$_{mAB}$, 22$_{mAC}$, 22$_{mAD}$) and sourced as current i$_{BLm}$ (i$_{BLmAB}$, i$_{BLmAC}$, i$_{BLmAD}$) to an integrator circuit 220. The output voltage for the decision z$_n$ result of the MAC decision operation is generated by the integrator circuit 220 across an integration capacitor Cout. The integrator circuit 220 includes a differential amplifier 222 having an inverting input terminal configured to receive a output reference voltage Vref,out. The integration capacitor Cout is connected in feedback between the output terminal of the amplifier 222 and the non-inverting input terminal. It is the sum of the currents i$_{BL1}$, ..., i$_{BLm}$ (i$_{BL1AB}$, ..., i$_{BLmAD}$) generated by the current mirror circuits $22_1, \ldots, 22_m$ ($22_{1AB}, \ldots, 22_{mAD}$) that is integrated on the output capacitor Cout. A switch formed, for example, by a MOSFET device connected in parallel with the capacitor Cout is selectively activated by reset signal (Reset) to discharge the capacitor Cout at the beginning of each MAC decision operation.

Again, it will be noted that the activation of one word line WL at a time performs a single multiply and accumulate (MAC) operation. Each MAC operation needed for the in-memory computation, for examine in connection with performing matrix-vector multiplication (MVM), requires a different word line selection.

Operation is this case provides for:

$$V_{OUT,n} = \sum_{i=1}^{m} \frac{Q_{OUT,i}}{C_{OUT}} = \frac{I_{BL,i}T_{ON,i}}{C_{OUT}} = \sum_{i=1}^{m} \frac{g_{i,n}(Vref, t)Vref}{C_{OUT}} \frac{v_i C_{RAMP}}{I_{RAMP}} =$$

$$\sum_{i=1}^{m} \frac{g_{i,n}(Vref, t)Vref}{C_{OUT}} \frac{v_i C_{RAMP}}{g_{ref}(Vref, t)Vref} = \frac{C_{RAMP}}{C_{OUT}} \sum_{i=1}^{m} \frac{g_{i,n}(Vref, t)v_i}{g_{ref}(Vref, t)}$$

Where: $V_{OUT,n}$, i.e., $z_n$, is the output voltage across the output capacitor Cout in response to the bit line currents from the memory cell transconductances $g_{1n}$ to $g_{mn}$, $Q_{OUT,i}$ is the corresponding charge contribution of BL<i>, where i=1, ..., m, COUT is the capacitance of the output capacitor Cout, $i_{BL,i}$ is the mirrored bit line current from the memory cell $14_{in}$, $T_{ON,i}$ is the duration of time for bit line BL<i> current flow for the analog signal $y_i$, $g_{i,n}$ is the transconductance of the memory cell $14_{i,n}$ corresponding to its programmed weight, Vref is the reference voltage, $v_i$ is the input voltage corresponding to the feature (or coefficient) data $x_i$, CRAMP is the capacitance of the ramp generator circuit capacitor 102, $g_{ref}$ is the transconductance of the reference memory cell $14_{ref}$.

The foregoing mathematical representation is applicable to the use of the circuits shown in FIGS. 2B, 2C and 2D along with either of the circuits shown in FIGS. 4A-1, 4A-2, 4B-1 and 4B-2.

The current mirror circuits $22_1, 22_2, \ldots, 22_m$ in FIGS. 4A-1, 4A-2, 4B-1 and 4B-2 are shown to have current mirroring ratios of A:B, A:C and A:D, respectively. In an embodiment, B, C and D may all be equal. In this case, each of the currents $i_{BL1}, i_{BL2}, \ldots, i_{BLm}$ generated by the current mirror circuits $22_1, 22_2, \ldots, 22_m$ are given equal weight for the integration process. For this implementation, the biasing circuits $20_1, 20_2, \ldots, 20_m$ connected to the current mirror circuits $22_1, 22_2, \ldots, 22_m$ will be driven in response to inputs $v_1, v_2, \ldots, v_m$, respectively, as shown in FIGS. 4A-1 and 4B-1.

In an alternative embodiment, however, B, C and D are not equal. In this case, each of the currents $i_{BL1}, i_{BL2}, \ldots, i_{BLm}$ generated by the current mirror circuits $22_1, 22_2, \ldots, 22_m$ are given different weights for the integration process. For example only, in an embodiment supporting binary weighting: B=4, C=2 and D=1. The currents $i_{BL1}, i_{BL2}, \ldots, i_{BLm}$ for the integration in this case will be binary weighted. For this implementation, the biasing circuits $20_1, 20_2, \ldots, 20_m$ connected to the current mirror circuits $22_1, 22_2, \ldots, 22_m$ will be driven in response to a common input $v_m$ as shown in FIGS. 4A-2 and 4B-2.

It will be noted that with the use of the biasing circuit $20_m$ embodiment as shown in FIG. 2D, the current mirror circuit $22_m$ in FIGS. 4A-1, 4A-2, 4B-1 and 4B-2 may be provided by the current mirror formed by transistors 70, 80 and 82. In other words, transistor 82 would correspond to the output transistor for the current mirror $22_m$. In this implementation, in the event that binary weighting is desired, the current mirroring ratio (A:B, A:C or A:D) would be implemented between transistors 70 and 82 and, as discussed above in connection with FIGS. 4B-1 and 4B-2, the biasing circuits $20_1, 20_2, \ldots, 20_m$ will be driven in response to a common input $v_m$.

Figure 5:
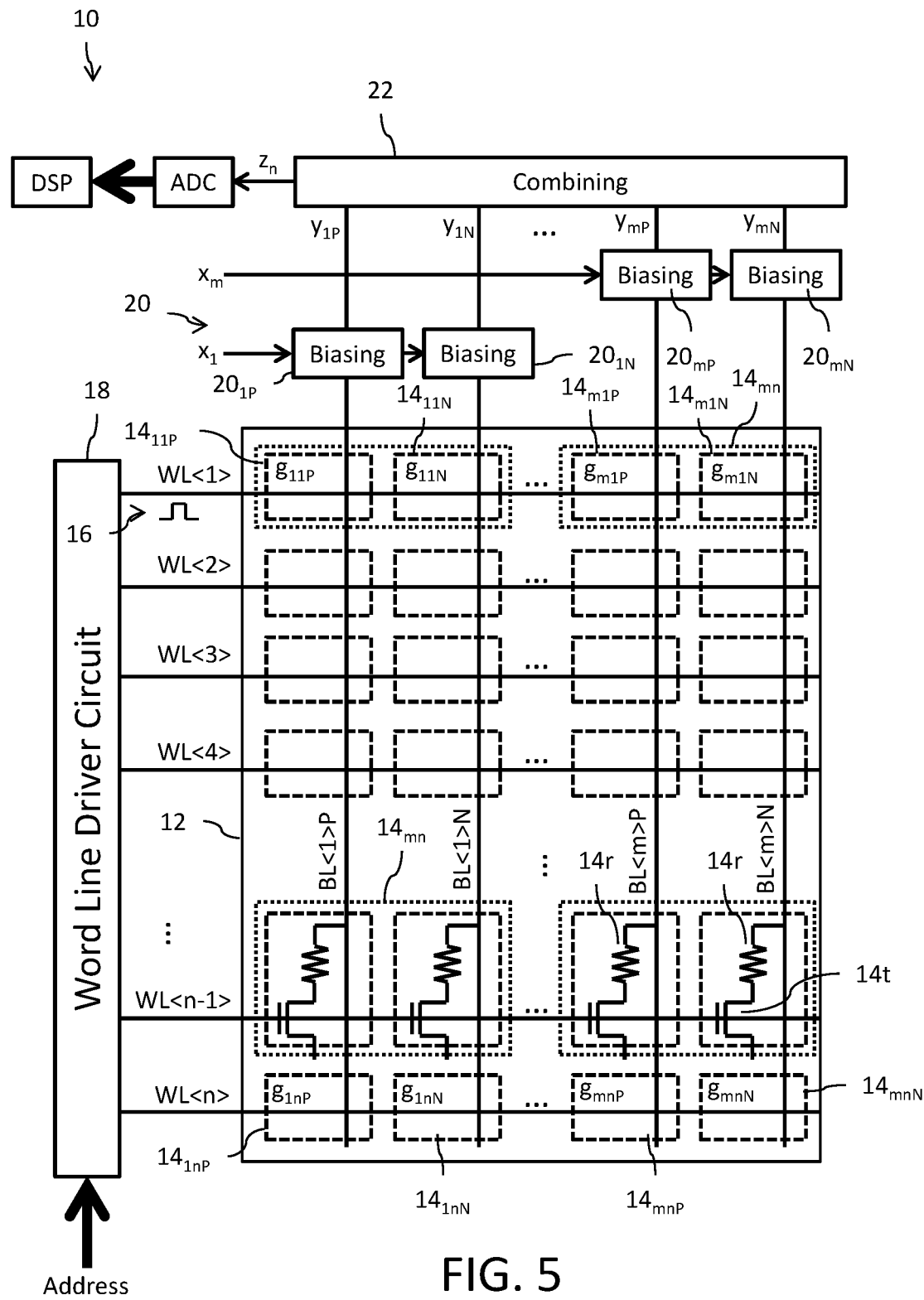
FIG. 5 is a schematic diagram of another embodiment for an in-memory computation circuit.

Reference is now made to FIG. 5 which shows a schematic diagram of another embodiment for an in-memory computation circuit 10. Like references in FIGS. 1 and 5 refer to like or similar components. The circuit 10 utilizes a memory array 12 formed by a plurality of memory cells 14 arranged in a matrix format having m columns and n rows. Each memory cell $14_{mn}$ comprises a pair of bit-cells $14_{mnP}$ and $14_{mnN}$. In this context, the index mn indicates the column (m) and row (n) location of the cell 14, while the suffix of P indicates that the bit-cell is for storing a positive (+) weight and the suffix of N indicates that the bit-cell is for storing a negative (−) weight. Thus, P suffix bit-cells are programmed to store data $g_{mnP}$ relating to the positive computational weights for an in-memory compute operation, while N suffix bit-cells are programmed to store data $g_{mnN}$ relating to the negative computational weights for an in-memory compute operation. Only one of the bit-cells in the pair for each memory cell 14 stores a weight value. In other words, the memory cell $14_{mn}$ stores either a positive weight in the positive bit-cell $14_{mnP}$ or stores a negative weight in the negative bit-cell $14_{mnN}$.

In this configuration, all of the bit-cells $14_{mnP}$ together may be considered to form a first bank of the memory array and all of the bit-cells $14_{mnN}$ together may be considered to form a second bank of the memory array.

Each memory cell $14_{mn}$ includes a word line WL and a pair of bit lines BL. The pair of bit-cells $14_{mnP}$ and $14_{mnN}$ in the memory cells 14 in a common row of the matrix are connected to each other through a common word line WL<n>. The positive bit-cells $14_{mnP}$ of the memory cells 14 in a common column of the matrix are connected to each other through a common positive bit line BL<m>P, while the negative bit-cells $14_{mnN}$ of the memory cells 14 in a common column of the matrix are connected to each other through a common negative bit line BL<m>N.

The word lines WL<1>, ..., WL<n> are driven by a word line driver circuit 18 which generates word line signals 16 in response to a received address signal (Address). The word line driver circuit 18 decodes the Address and applies the pulse of the word line signal 16 to one word line WL at a time (illustrated here, as an example, as being applied to word line WL<1>). The pulse width of each word line signal 16 is fixed and defined by an on time $T_{ON}$.

It is important to note here that the activation of one word line WL at a time performs a single multiply and accumulate (MAC) operation. In order to perform matrix-vector multiplication (MVM), where k MAC operations are implemented (k being less than or equal to n), a sequence of k word line WL activations are required. Consequently, k word line WL on time (Ton) cycles are necessary for the performance of one full MVM operation.

Biasing circuitry 20 applies a bias (time, voltage and/or current) to the positive and negative bit lines BL in response to feature (or coefficient) data x input to the in-memory computation circuit 10. This feature data may, for example, comprise a plurality of multi-bit digital signals $x_1, \ldots, x_m$ that are processed by the biasing circuits $20_{1P}, 20_{1N}, \ldots, 20_{mP}, 20_{mN}$ to generate the bias applied to the corresponding word lines WL<1>P, WL<1>N, ..., WL<n>P, WL<n>N. The biasing circuit $20_{mP}$ is coupled to the positive bit line BL<m>P and the biasing circuit $20_{mN}$ is coupled to the negative bit line BL<m>N, with those biasing circuits both receiving the digital signal $x_m$. The positive or negative analog signal $y_{mP}$, $y_{mN}$ on the positive or negative bit line BL<m>P, BL<m>N (i.e., the bit line charge) at the column output is then dependent on a product between the bias applied to the bit line and the transconductance $g_{mnP}$ or $g_{mnN}$ (which corresponds to the programmed resistivity) of the bit-cell of the memory cell $14_{mn}$ selected by the word line WL to which the word line signal 16 is applied. In other words, the memory cell 14 contributes either a (positive) bit line current for the positive analog signal $y_{mP}$ that is proportional to $x_m \times g_{mnP}$, or a (negative) bit line current for the negative analog signal $y_{mN}$ that is proportional to $x_m \times g_{mnN}$. So, for an example where the word line signal 16 is applied to word line WL<1>, and the positive bit-cell $14_{11P}$ of the memory cell $14_{11}$ is programmed with the in-memory computation weight, the positive analog signal $y_{1P}$ current on the positive bit line BL<1>P is proportional to $x_1 \times g_{11P}$, and the negative analog signal $y_{1N}$ current on the negative bit line BL<1>N is zero. Conversely, if instead the negative bit-cell $14_{11N}$ of the memory cell $14_{11}$ is programmed with the in-memory computation weight, the positive analog signal $y_{1P}$ current on the positive bit line BL<1>P is zero, and the negative analog signal $y_{1N}$ current on the negative bit line BL<1>N is proportional to $x_1 \times g_{11N}$. A similar operation is performed for each column.

The biasing circuits $20_{1P}$, $20_{1N}$, ..., $20_{mP}$, $20_{mN}$ of the biasing circuitry 20 may have any one of the circuit configurations as shown in FIGS. 2B-2D.

A combining circuit 22 combines, for example through an integration operation, the analog signal $y_{1P}$, $y_{1N}$, ... $y_{mP}$, $y_{mN}$ currents at the column outputs to generate a corresponding decision $z_n$ result for the MAC decision operation, where $z_n = (\pm g_{1n} \times x_1) + (\pm g_{2n} \times x_2) + \ldots + (\pm g_{mn} \times x_m)$, and where the ± symbol indicates a taking into account of whether the weight $g_{mn}$ is positive or negative. Further processing of the decision $z_n$ result may, for example, be made by converting the analog decision signal $z_n$ to a digital value using an analog-to-digital converter (ADC) which is then processed in a digital signal processing (DSP) circuit.

Figures 1, 6:
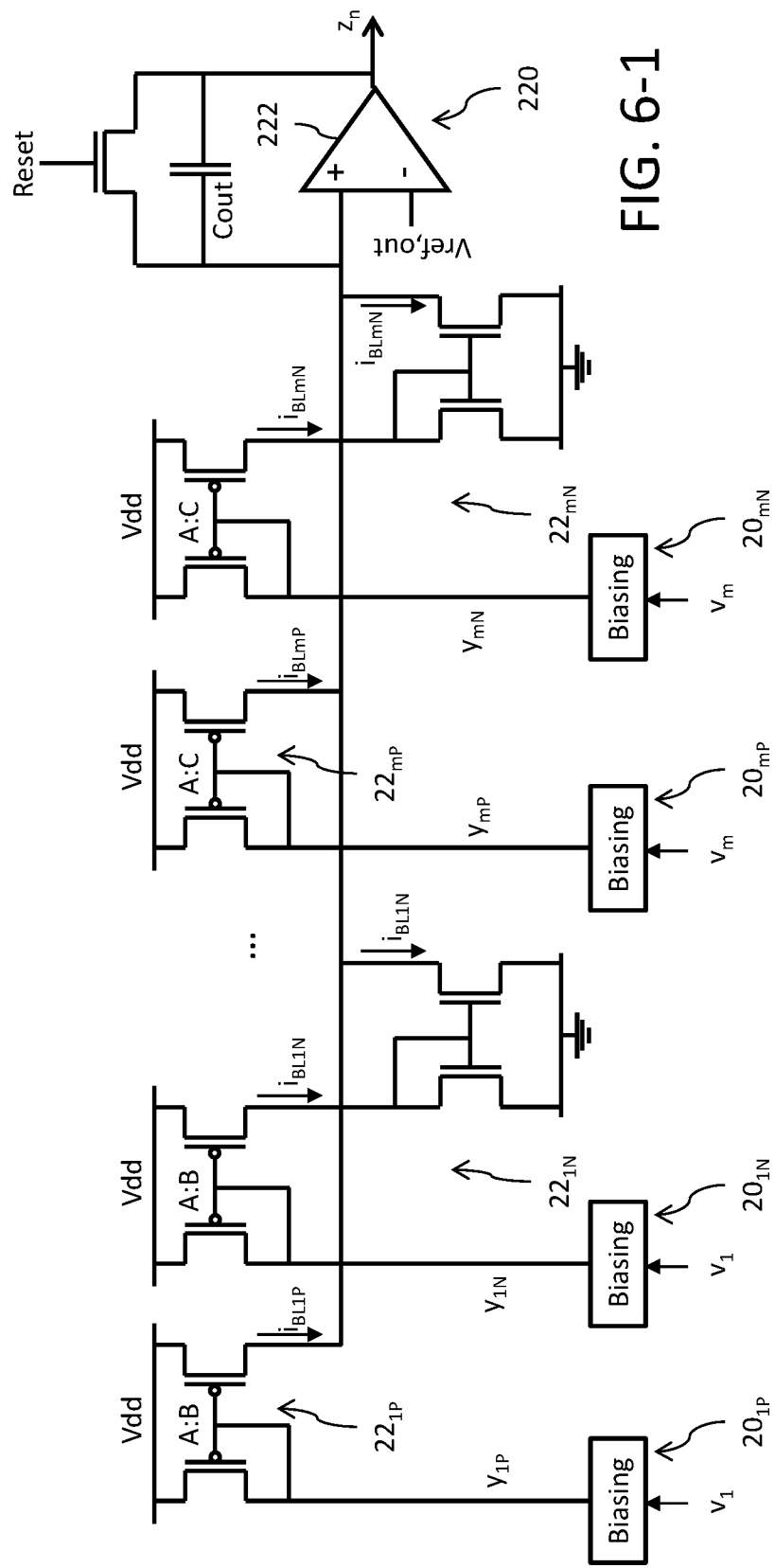
Figures 2, 6:
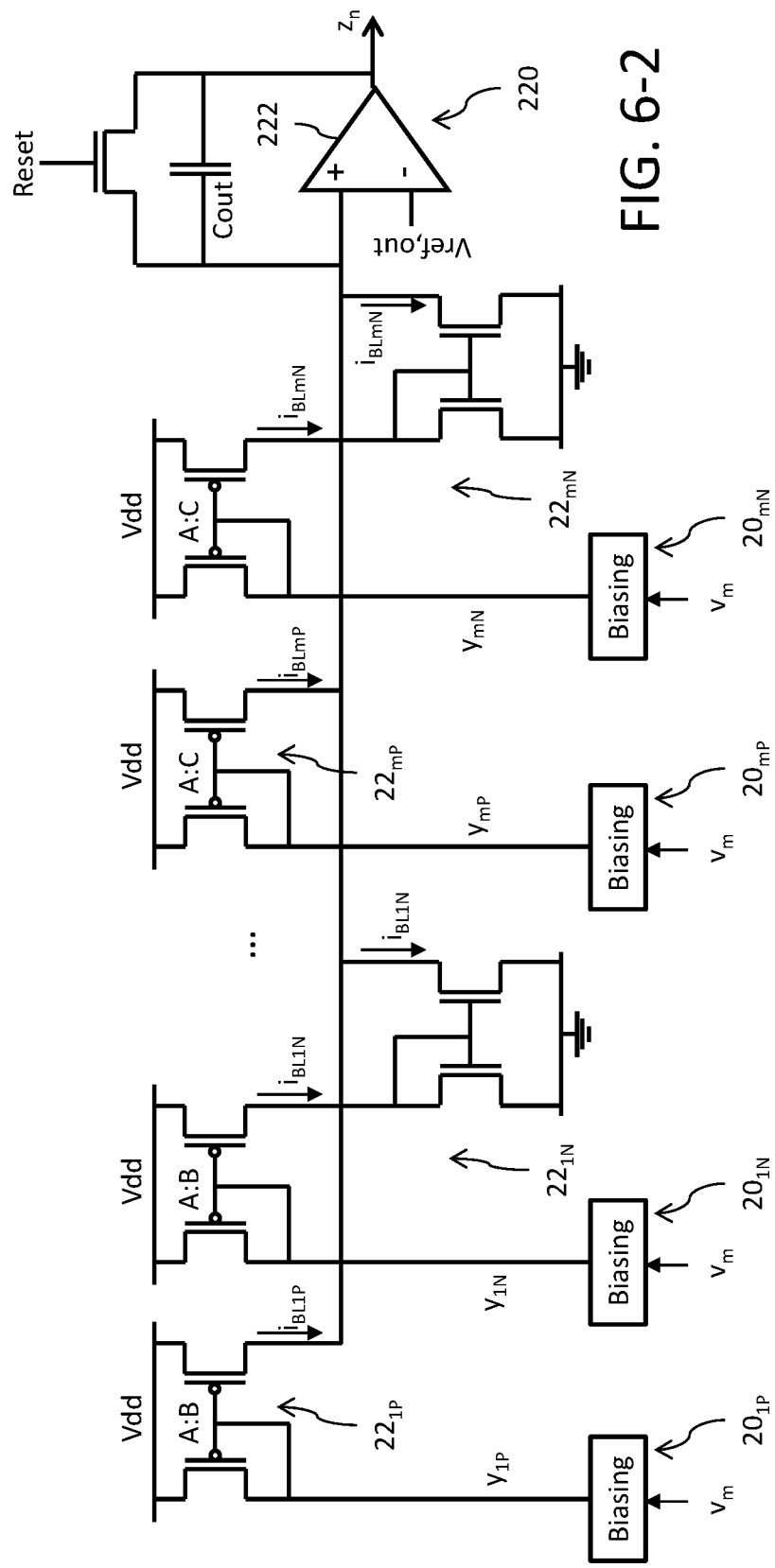

Reference is now made to FIGS. 6-1 and 6-2 which each show an embodiment for the combining circuit 22 for use with the implementation of FIG. 5. The positive analog signal $y_{mP}$ is dependent on the bit line current from the positive bit-cell $14_{mnP}$ at the column output which is mirrored by a current mirror circuit $22_{mP}$ and sourced as positive current $i_{BLmP}$ to an integrator circuit 220. The negative analog signal $y_{mN}$ is dependent on the bit line current from the negative bit-cell $14_{mnP}$ at the column output which is mirrored by a current mirror circuit $22_{mN}$ and sunk as negative current $i_{BLmN}$ from the integrator circuit 220. The output voltage for the decision $z_n$ result of the MAC decision operation is generated by the integrator circuit 220 across an integration capacitor Cout. The integrator circuit 220 includes a differential amplifier 222 having an inverting input terminal configured to receive a output reference voltage Vref,out. The integration capacitor Cout is connected in feedback between the output terminal of the amplifier 222 and the non-inverting input terminal. It is the sum of the currents $i_{BL1P}$, $i_{BL1N}$, ..., $i_{BLmP}$, $i_{BLmN}$ generated by the current mirror circuits $22_{1P}$, $22_{1N}$, $22_{mP}$, $22_{mN}$ that is integrated on the output capacitor Cout. A switch formed, for example, by a MOSFET device connected in parallel with the capacitor Cout is selectively activated by reset signal (Reset) to discharge the capacitor Cout at the beginning of each MAC decision operation.

The current mirror circuits $22_{1P}$, $22_{1N}$, ..., $22_{mP}$, $22_{mN}$ in FIGS. 6-1 and 6-2 are shown to have current mirroring ratios of A:B, and A:C, respectively. In an embodiment, B and C may all be equal. In this case, the currents $i_{BL1P}$, $i_{BL1N}$ generated by the current mirror circuits $22_{1P}$, $22_{1N}$ and the currents $i_{BLmP}$, $i_{BLmN}$ generated by the current mirror circuits $22_{mP}$, $22_{mN}$ are given equal weight for the integration process. For this implementation, the biasing circuits $20_{1P}$, $20_{1N}$, $20_{mP}$, $20_{mN}$ connected to the current mirror circuits $22_{1P}$, $22_{1N}$, ..., $22_{mP}$, $22_{mN}$ will be driven in response to inputs $v_1$, $v_2$, ..., $v_m$, respectively, as shown in FIG. 6-1.

In an alternative embodiment, however, B and C are not equal. In this case, the currents $i_{BL1P}$, $i_{BL1N}$ generated by the current mirror circuits $22_{1P}$, $22_{1N}$ and the currents $i_{BLmP}$, $i_{BLmN}$ generated by the current mirror circuits $22_{mP}$, $22_{mN}$ are given different weights for the integration process. For example only, in an embodiment supporting binary weighting: B=2, C=1. The currents for the integration in this case will be binary weighted. For this implementation, the biasing circuits $20_{1P}$, $20_{1N}$, ..., $20_{mP}$, $20_{mN}$ connected to the current mirror circuits $22_{1P}$, $22_{1N}$, ..., $22_{mP}$, $22_{mN}$ will be driven in response to input $v_m$, as shown in FIG. 6-2.

It will be noted that with the use of the biasing circuit $20_m$ embodiment as shown in FIG. 2D, the current mirror circuit $22_{mP}$ or $22_{mN}$ in FIG. 6 may be provided by the current mirror formed by transistors 70, 80 and 82. In other words, transistor 82 would correspond to the output transistor for the current mirror $22_{mP}$ or $22_{mN}$. In this implementation, in the event that binary weighting is desired, the current mirroring ratio (A:B, A:C) would be implemented between transistors 70 and 82 and, as discussed above in connection with FIG. 6-2, the biasing circuits $20_{1P}$, $20_{1N}$, ..., $20_{mP}$, $20_{mN}$ will be driven in response to a common input $v_m$.

Figure 7:
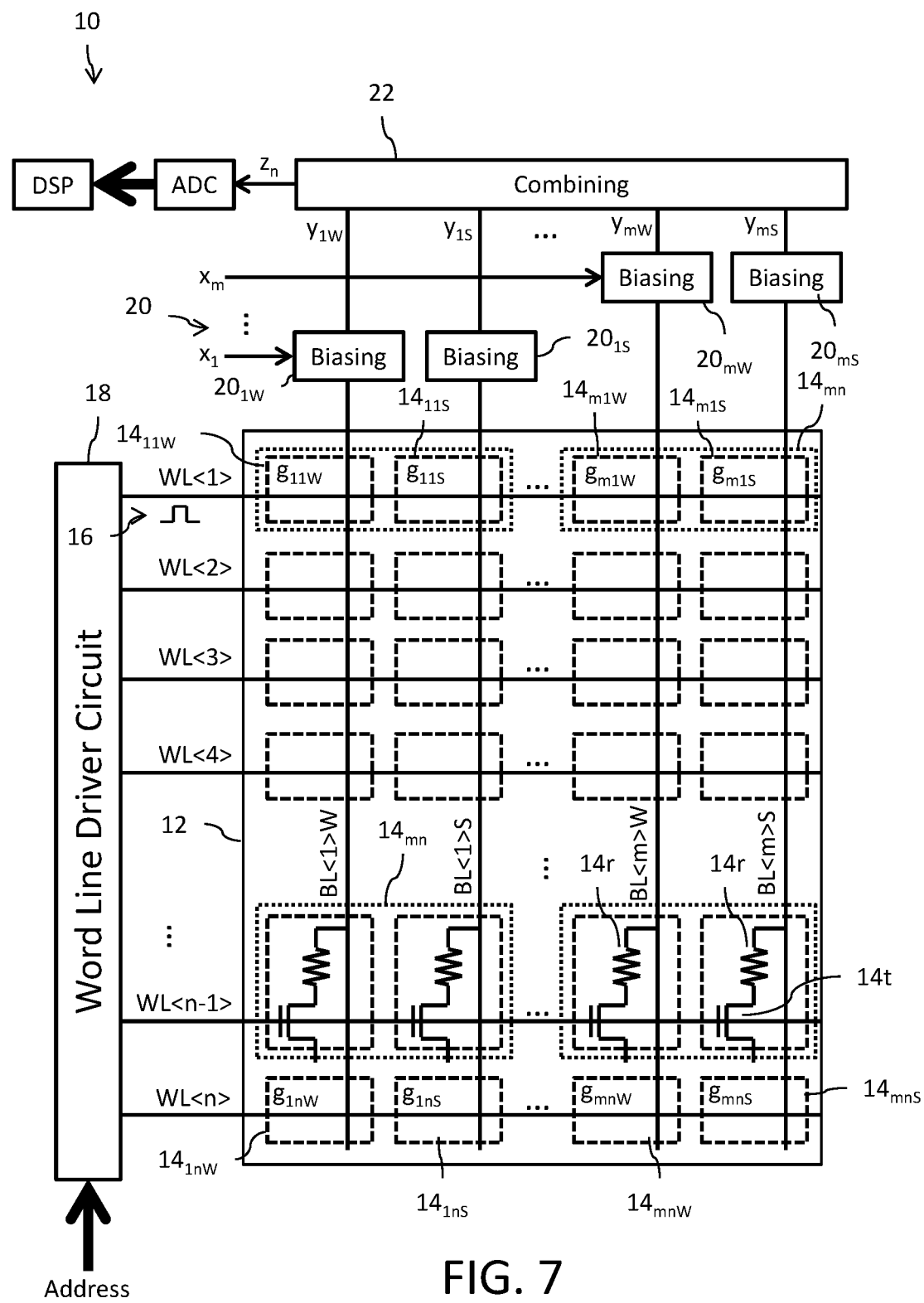
FIG. 7 is a schematic diagram of another embodiment for an in-memory computation circuit.

Reference is now made to FIG. 7 which shows a schematic diagram of a further embodiment for an in-memory computation circuit 10. Like references in FIGS. 1, 5 and 7 refer to like or similar components. The circuit 10 utilizes a memory array 12 formed by a plurality of memory cells 14 arranged in a matrix format having m columns and n rows. Each memory cell $14_{mn}$ comprises a pair of bit-cells $14_{mnW}$ and $14_{mnS}$. In this context, the index mn indicates the column (m) and row (n) location of the cell 14, while the suffix of W indicates that the bit-cell is for storing a weight and the suffix of S indicates that the bit-cell is for storing a sign (positive or negative) for that weight.

Each memory cell 14 includes a word line WL and a pair of bit lines BL. The pair of bit-cells $14_{mnW}$ and $14_{mnS}$ in the memory cells 14 in a common row of the matrix are connected to each other through a common word line WL<n>. The weight bit-cells $14_{mnW}$ of the memory cells 14 in a common column of the matrix are connected to each other through a common weight bit line BL<m>W, while the sign bit-cells $14_{mnS}$ of the memory cells 14 in a common column of the matrix are connected to each other through a common sign bit line BL<m>S.

The word lines WL<1>, ..., WL<n> are driven by a word line driver circuit 18 which generates word line signals 16 in response to a received address signal (Address). The word line driver circuit 18 decodes the Address and applies the pulse of the word line signal 16 to one word line WL at a time (illustrated here, as an example, as being applied to word line WL<1>). The pulse width of each word line signal 16 is fixed and defined by an on time $T_{ON}$. It is important to note here that the activation of one word line WL at a time performs a single multiply and accumulate (MAC) operation. In order to perform matrix-vector multiplication (MVM), where k MAC operations are implemented (k being less than or equal to n), a sequence of k word line WL activations are required. Consequently, k word line WL on time (Ton) cycles are necessary for the performance of one full MVM operation.

Biasing circuitry 20 applies a bias (time, voltage and/or current) to the weight bit lines BL in response to feature (or coefficient) data x input to the in-memory computation circuit 10. This feature data may, for example, comprise a plurality of multi-bit digital signals $x_1, \ldots, x_m$ that are processed by the biasing circuits $20_{1W}, \ldots, 20_{mW}$ to generate the bias applied to the corresponding word lines WL<1>W, ..., WL<n>W. The analog signal $y_{mW}$ on the weight bit line BL<m>W, (i.e., the weight bit line charge) at the column output is then dependent on a product between the bias applied to the bit line and the transconductance $g_{mnW}$ (which corresponds to the programmed resistivity) of the weight bit-cell of the memory cell $14_{mn}$ selected by the word line WL to which the word line signal 16 is applied. In other words, the weight bit-cell contributes a bit line current for the analog signal $y_{mW}$ that is proportional to $x_m \times g_{mnW}$. So, for an example where the word line signal 16 is applied to word line WL<1>, and the weight bit-cell $14_{11W}$ of the memory cell $14_{11}$ is programmed with the in-memory computation weight, the analog signal $y_{1W}$ current on the weight bit line BL<1>W is proportional to $x_1 \times g_{11W}$. A similar operation is performed for each column.

The biasing circuits $20_{1W}, \ldots, 20_{mW}$ of the biasing circuit 20 may have any one of the circuit configurations as shown in FIGS. 2B-2D.

Sign bit lines BL<m>S can optionally have biasing circuitry 20, but the applied bias is not dependent on the feature (or coefficient) data x input to the in-memory computation circuit 10. Circuit embodiments for the biasing circuits $20_{mS}$ on the sign bit lines BL<m>S are shown in FIGS. 2B-S, 2C-S and 2D-S and have a similar circuit configuration as the biasing circuit $20_{mW}$ used for the weight bit lines BL<m>W as shown in FIGS. 2B, 2C and 2D. These circuits apply the bias voltage Vref to each of the sign bit lines BL<m>S.

The analog signal $y_{mS}$ on the sign bit line BL<m>S, (i.e., the sign bit line charge) is dependent on the transconductance gums (which corresponds to the programmed resistivity) of the sign bit-cell of the memory cell $14_{mn}$ selected by the word line WL to which the word line signal 16 is applied. So, for an example where the word line signal 16 is applied to word line WL<1>, and the sign bit-cell $14_{11S}$ of the memory cell $14_{11}$ is programmed with a positive sign, there is a zero analog signal $y_{1S}$ current on the sign bit line BL<1>S. Conversely, if the sign bit-cell $14_{11S}$ of the memory cell $14_{11}$ is programmed with a negative sign, there is a non-zero analog signal $y_{1S}$ current on the sign bit line BL<1>S. A similar operation is performed for each column.

A combining circuit 22 combines, for example through an integration operation, the analog signal $y_{1W}, \ldots, y_{mW}$ currents, as a function of the analog signal $y_{1S}, \ldots, y_{mS}$ currents (which indicate whether the weight $g_{mnW}$ is positive or negative), to generate a corresponding decision $z_n$ result for the MAC decision operation, where $z_n = (\pm g_{1n} \times x_1) + (\pm g_{2n} \times x_2) + \ldots + (\pm g_{mn} \times x_m)$, and where the $\pm$ symbol indicates the taking into account of whether the weight is positive or negative. Further processing of the decision $z_n$ result may, for example, be made by converting the analog decision signal $z_n$ to a digital value using an analog-to-digital converter (ADC) which is then processed in a digital signal processing (DSP) circuit.

Figures 1, 8:
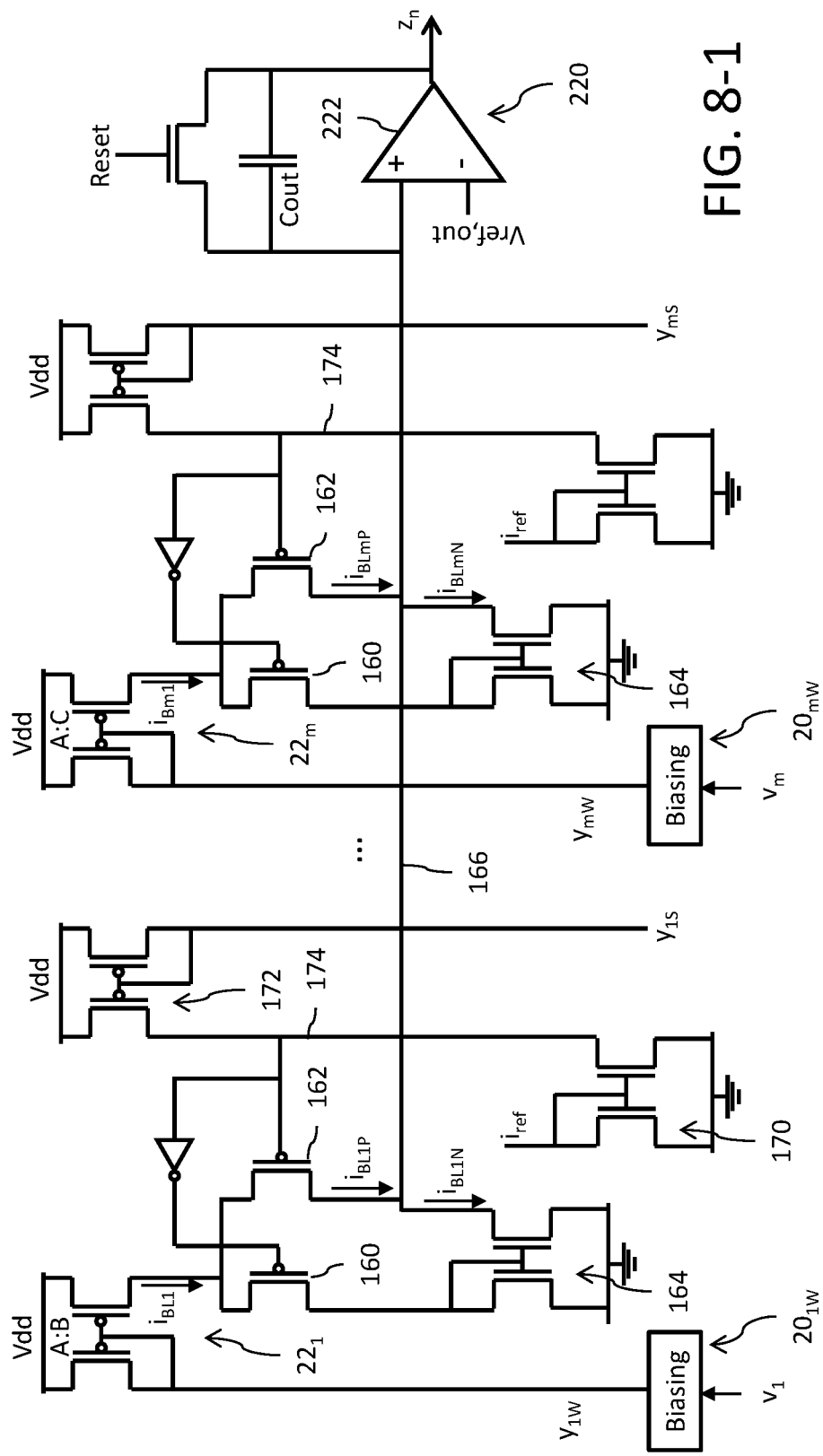
Figures 2, 8:
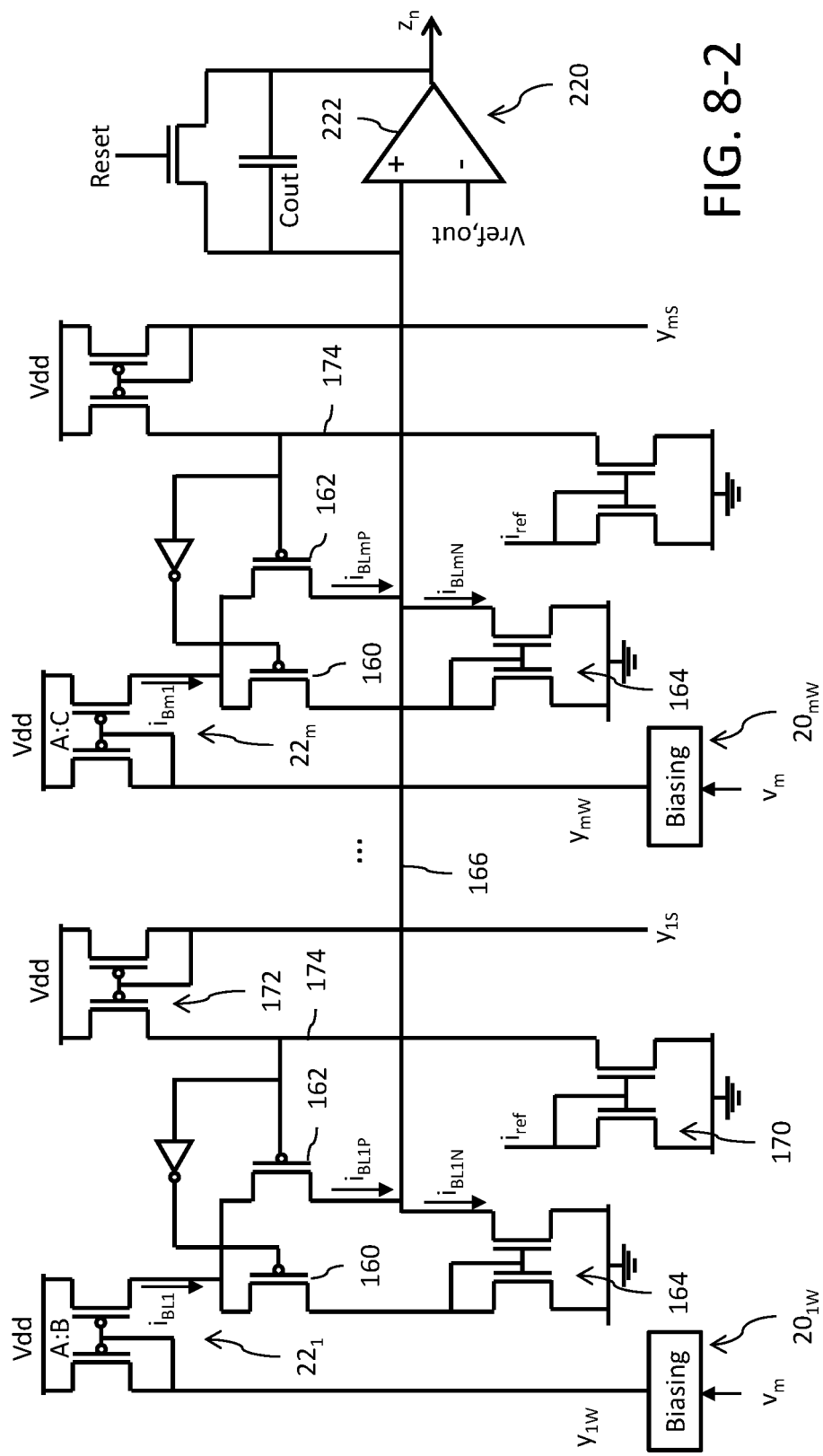

Reference is now made to FIGS. 8-1 and 8-2 which shows an embodiment for the combining circuit 22 for use with the implementation of FIG. 7. The analog signal $y_{mW}$ which is the bit line current from the weight bit-cell $14_{mnW}$ at the column output is mirrored by a current mirror circuit $22_m$ and sourced as current $i_{BLm}$ to a current switching circuit formed by a pair of MOSFET devices 160, 162. When device 160 is turned on, the current $i_{BLm}$ is inverted by a current mirror circuit 164 and sunk as negative current $i_{BLmN}$ from node 166. Conversely, when device 162 is turned on, the current $i_{BLm}$ is sourced as positive current $i_{BLmP}$ to node 166. The analog signal $y_{mS}$ which is the bit line current from the sign bit-cell $14_{mnS}$ is compared to a reference current $i_{ref}$ using a comparison circuit formed by pair of current mirrors 170, 172. The result of the current comparison is a logic signal output at node 174 and applied to drive the operation of the transistors 160, 162 of the current switching circuit. The logic signal output at node 174 is applied to the gate of transistor 160 and further applied to the gate of transistor 164 through a logic inverter. When the bit line current from the sign bit-cell $14_{mnS}$ is less than the reference current $i_{ref}$, this being indicative of the sign bit-cell $14_{mnS}$ is storing a value for a positive sign, the logic signal at node 174 is logic low causing the transistor 162 to turn on (and the transistor 160 to turn off). The positive current $i_{BLmP}$ is then sourced to node 166. On the other hand, when the bit line current from the sign bit-cell $14_{mnS}$ is more than the reference current $i_{ref}$, this being indicative of the sign bit-cell $14_{mnS}$ is storing a value for a negative sign, the logic signal at node 174 is logic high causing the transistor 160 to turn on (and the transistor 162 to turn off). The negative current $i_{BLmN}$ is then sunk from node 166.

The currents sourced to/sunk from the node 166 are applied to an integrator circuit 220. The output voltage for the decision $z_n$ result of the MAC decision operation is generated by the integrator circuit 220 across an integration capacitor Cout. The integrator circuit 220 includes a differential amplifier 222 having an inverting input terminal configured to receive a output reference voltage Vref,out. The integration capacitor Cout is connected in feedback between the output terminal of the amplifier 222 and the non-inverting input terminal. It is the sum of the currents $i_{BL1P}$ (or $i_{BL1N}$), ..., $i_{BLmP}$ (or $i_{BLmN}$) applied to node 166 that is integrated on the output capacitor Cout. A switch formed, for example, by a MOSFET device connected in parallel with the capacitor Cout is selectively activated by reset signal (Reset) to discharge the capacitor Cout at the beginning of each MAC decision operation.

The current mirror circuits $22_1, \ldots, 22_m$ in FIGS. 8-1 and 8-2 are shown to have current mirroring ratios of A:B, and A:C, respectively. In an embodiment, B and C may all be equal. In this case, each of the currents $i_{BL1}, \ldots, i_{BLm}$ generated by the current mirror circuits $22_1, \ldots, 22_m$ are given equal weight for the integration process. For this implementation, the biasing circuits $20_{1W}, \ldots, 20_{mW}$ connected to the current mirror circuits $22_1, \ldots, 22_m$ will be driven in response to inputs $v_1, \ldots, v_m$, respectively, as shown in FIG. 8-1.

In an alternative embodiment, however, B and C are not equal. In this case, the currents $i_{BL1}, i_{BLm}$ generated by the current mirror circuits $22_1, 22_m$ are given different weights for the integration process. For example only, in an embodiment supporting binary weighting: B=2, C=1. The currents $i_{BL1}, i_{BLm}$ for the integration in this case will be binary weighted. For this implementation, the biasing circuits $20_{1W}, \ldots, 20_{mW}$ connected to the current mirror circuits $22_1, \ldots, 22_m$ will be driven in response to input $v_m$ as shown in FIG. 8-2.

It will be noted that with the use of the biasing circuit $20_m$ embodiment as shown in FIG. 2D, the current mirror circuit $22_m$ in FIG. 8 may be provided by the current mirror formed by transistors 70, 80 and 82. In other words, transistor 82 would correspond to the output transistor for the current mirror $22_m$. In this implementation, in the event that binary weighting is desired, the current mirroring ratio (A:B, or A:C) would be implemented between transistors 70 and 82 and, as discussed above in connection with FIG. 8-2, the biasing circuits $20_{1W}, \ldots, 20_{mW}$ will be driven in response to a common input $v_m$.

Figure 9:
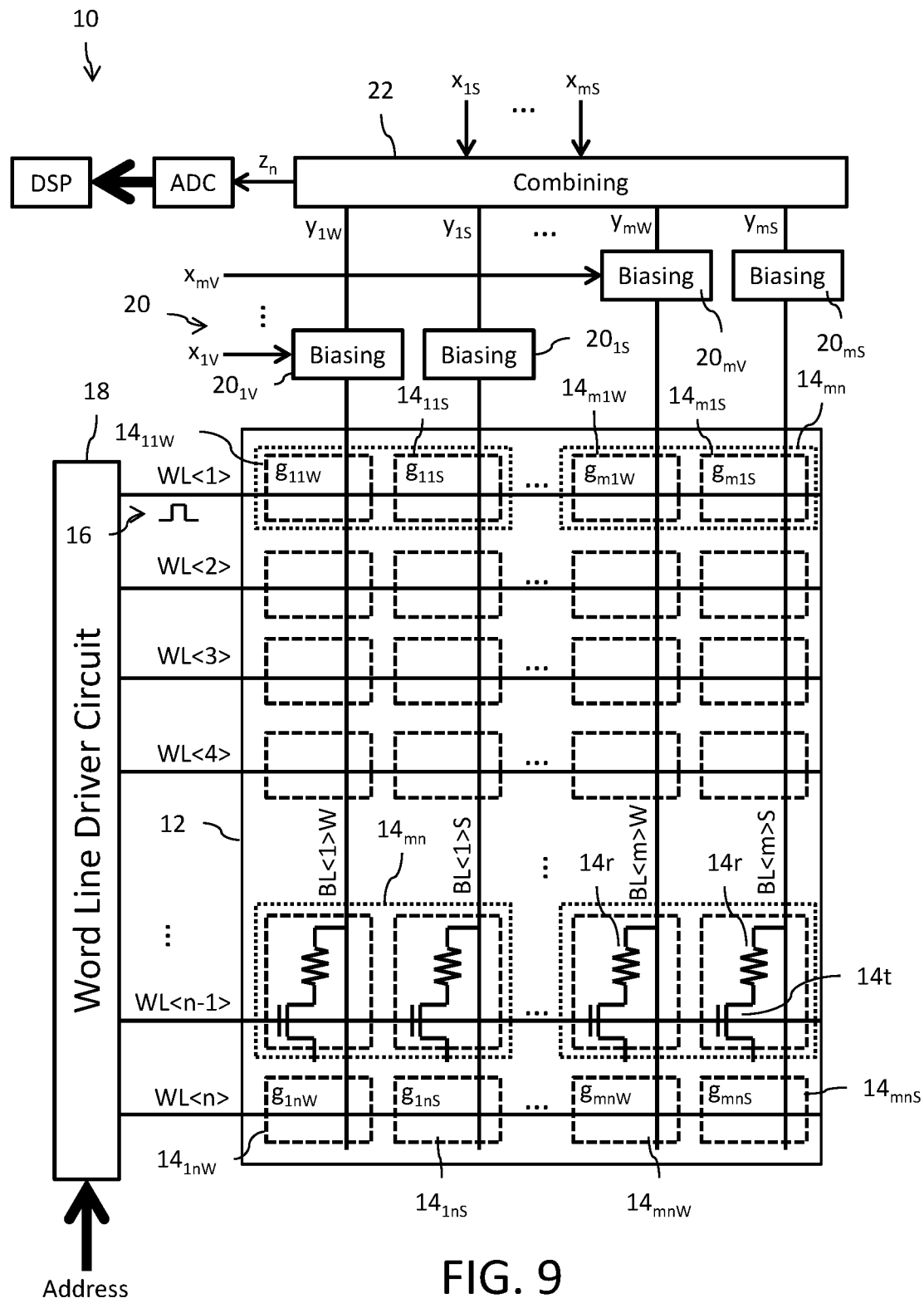
FIG. 9 is a schematic diagram of another embodiment for an in-memory computation circuit.

Reference is now made to FIG. 9 which shows a schematic diagram of a further embodiment for an in-memory computation circuit 10. Like references in FIGS. 7 and 9 refer to like or similar components. The circuit 10 utilizes a memory array 12 formed by a plurality of memory cells $14_{mn}$ arranged in a matrix format having m columns and n rows. Each memory cell 14 comprises a pair of bit-cells $14_{mnW}$ and $14_{mnS}$. In this context, the index mn indicates the column (m) and row (n) location of the cell 14, while the suffix of W indicates that the bit-cell is for storing a weight and the suffix of S indicates that the bit-cell is for storing a sign (positive or negative) for that weight.

Each memory cell 14 includes a word line WL and a pair of bit lines BL. The pair of bit-cells $14_{mnW}$ and $14_{mnS}$ in the memory cells 14 in a common row of the matrix are connected to each other through a common word line WL<n>. The weight bit-cells $14_{mnW}$ of the memory cells 14 in a common column of the matrix are connected to each other through a common weight bit line BL<m>W, while the sign bit-cells $14_{mnS}$ of the memory cells 14 in a common column of the matrix are connected to each other through a common sign bit line BL<m>S.

The word lines WL<1>, ..., WL<n> are driven by a word line driver circuit 18 which generates word line signals 16 in response to a received address signal (Address). The word line driver circuit 18 decodes the Address and applies the pulse of the word line signal 16 to one word line WL at a time (illustrated here, as an example, as being applied to word line WL<1>). The pulse width of each word line signal 16 is fixed and defined by an on time $T_{ON}$.

It is important to note here that the activation of one word line WL at a time performs a single multiply and accumulate (MAC) operation. In order to perform matrix-vector multiplication (MVM), where k MAC operations are implemented (k being less than or equal to n), a sequence of k word line WL activations are required. Consequently, k word line WL on time (Ton) cycles are necessary for the performance of one full MVM operation.

The circuit of FIG. 9 differs from the circuit of FIG. 7 in that it can also take into account the sign of the plurality of multi-bit digital signals $x_1, \ldots, x_m$ that form the feature data. In this case, consider that one bit $x_{mS}$ of each multi-bit digital signal $x_m$ is reserved for indicating the sign (positive or negative) of the feature data value. This bit $x_{mS}$ is input to the combining circuit 22. The remaining bits $x_{mV}$ of each multi-bit digital signal $x_m$ indicate the value of the feature data and are applied to biasing circuitry 20 through the voltage $v_m$.

The biasing circuitry 20 applies a bias (time, voltage and/or current) to the weight bit lines BL in response to the remaining bits $x_{mV}$ of the feature (or coefficient) data. The bits $x_{1V}, \ldots, x_{mV}$ are processed by the biasing circuits $20_{1W}, \ldots, 20_{mW}$ to generate the bias applied to the corresponding word lines WL<1>W, WL<n>W. The analog signal $y_{mW}$ on the weight bit line BL<m>W, (i.e., the weight bit line charge) at the column output is then dependent on a product between the bias applied to the bit line and the transconductance $g_{mnW}$ (which corresponds to the programmed resistivity) of the weight bit-cell of the memory cell $14_{mn}$ selected by the word line WL to which the word line signal 16 is applied. In other words, the weight bit-cell contributes a bit line current for the analog signal $y_{mW}$ that is proportional to $x_{mV} \times g_{mnW}$. So, for an example where the word line signal 16 is applied to word line WL<1>, and the weight bit-cell $14_{11W}$ of the memory cell $14_{11}$ is programmed with the in-memory computation weight, the analog signal $y_{1W}$ current on the weight bit line BL<1>W is proportional to $x_{1V} \times g_{11W}$. A similar operation is performed for each column.

The biasing circuits $20_{1W}, \ldots, 20_{mW}$ of the biasing circuitry 20 may have any one of the circuit configurations as shown in FIGS. 2B-2D.

There is also biasing circuitry 20 for the sign bit lines BL<m>S, but the applied bias is not dependent on the feature (or coefficient) data x input to the in-memory computation circuit 10. Circuit embodiments for the biasing circuits $20_{mS}$ on the sign bit lines BL<m>S are shown in FIGS. 2B-S, 2C-S and 2D-S and have a similar circuit configuration as the biasing circuit $20_{mW}$ used for the weight bit lines BL<m>W as shown in FIGS. 2B, 2C and 2D. These circuits apply the bias voltage Vref to each of the sign bit lines BL<m>S.

The analog signal $y_{mS}$ on the sign bit line BL<m>S, (i.e., the sign bit line charge) is dependent on the transconductance (which corresponds to the programmed resistivity) of the sign bit-cell of the memory cell $14_{mn}$ selected by the word line WL to which the word line signal 16 is applied. So, for an example where the word line signal 16 is applied to word line WL<1>, and the sign bit-cell $14_{11S}$ of the memory cell 14ii is programmed with a positive sign, there is a zero analog signal $y_{1S}$ current on the sign bit line BL<1>S. Conversely, if the sign bit-cell $14_{11S}$ of the memory cell $14_{11}$ is programmed with a negative sign, there is a non-zero analog signal $y_{1S}$ current on the sign bit line BL<1>S. A similar operation is performed for each column.

The combining circuit 22 combines, for example through an integration operation, the analog signal $y_{1W}, \ldots, y_{mW}$ currents, as a function of the analog signal $y_{1S}, \ldots y_{mS}$ currents (which indicate whether the weight $g_{mn}$ is positive or negative) and the sign bit $x_{mS}$ (which indicate whether the multi-bit digital signal $x_m$ is a positive or negative feature data value), to generate a corresponding decision $z_n$ result for the MAC decision operation, where $z_n = (\pm g_{1n} \times \pm x_{1V}) + (\pm g_{2n} \times \pm x_{2V}) + \ldots + (\pm g_{mn} \times \pm x_{mV})$, and where the ± symbols indicate the taking into account of whether the weight and/or feature data value is positive or negative. Further processing of the decision $z_n$ result may, for example, be made by converting the analog decision signal $z_n$ to a digital value using an analog-to-digital converter (ADC) which is then processed in a digital signal processing (DSP) circuit.

Figures 1, 10:
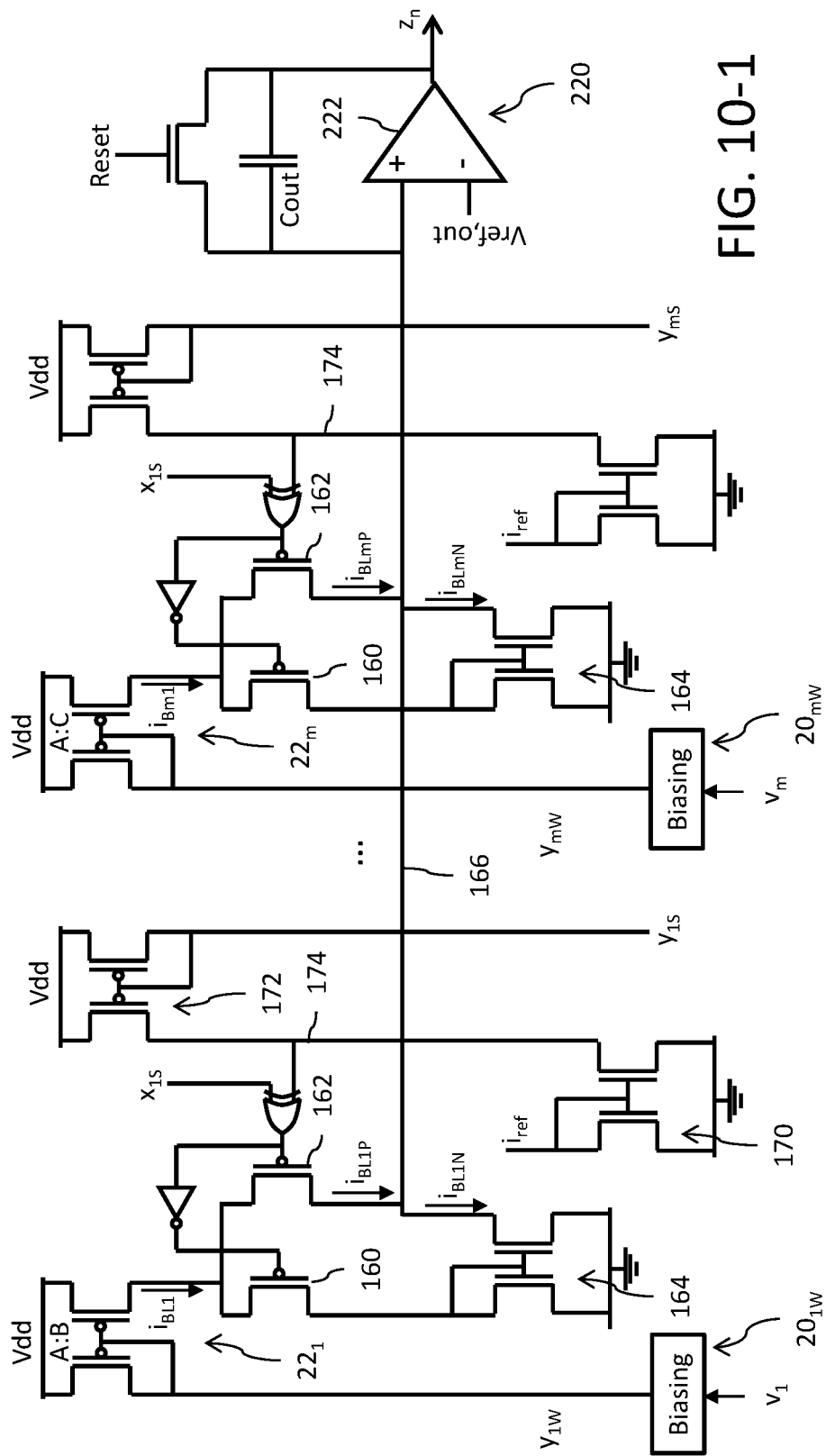
Figures 2, 10:
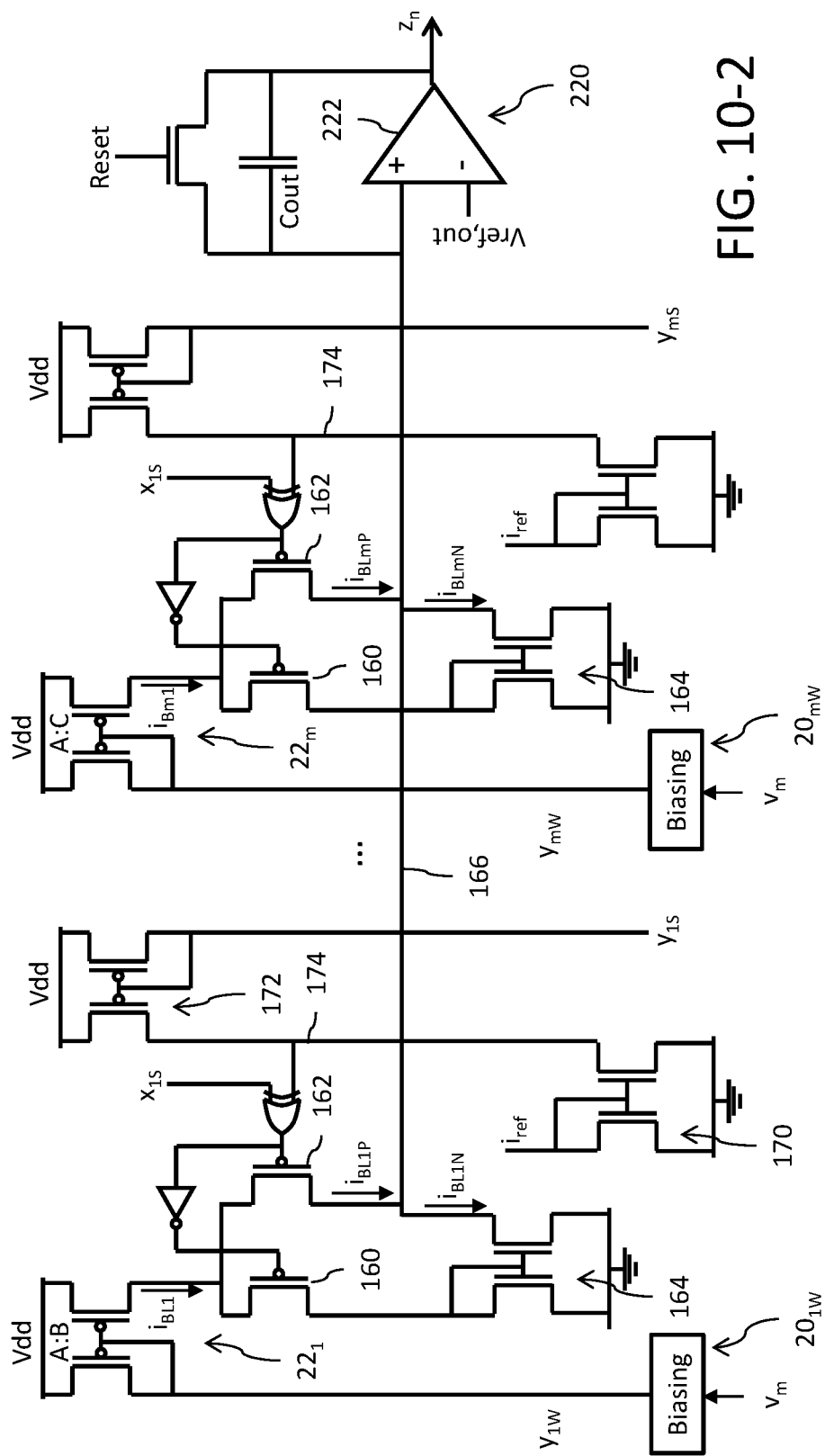

Reference is now made to FIGS. 10-1 and 10-2 which show an embodiment for the combining circuit 22 for use with the implementation of FIG. 9. The analog signal $y_{mW}$ which is the bit line current from the weight bit-cell $14_{mnW}$ at the column output is mirrored by a current mirror circuit $22_m$ and sourced as current $i_{BLm}$ to a current switching circuit formed by a pair of MOSFET devices 160, 162. When device 160 is turned on, the current $i_{BLm}$ is inverted by a current mirror circuit 164 and sunk as negative current $i_{BLmN}$ from node 166. Conversely, when device 162 is turned on, the current $i_{BLm}$ is sourced as positive current $i_{BLmP}$ to node 166. The analog signal $y_{mS}$ which is the bit line current from the sign bit-cell $14_{mnS}$ is compared to a reference current $i_{ref}$ using a comparison circuit formed by pair of current mirrors 170, 172. The result of the current comparison is a logic signal output at node 174. The logic signal at node 174 is then logically combined with the sign bit $x_{mS}$ to produce a control signal that is applied to drive the operation of the transistors 160, 162 of the current switching circuit. The logic circuit for logically combining the logic signal at node 174 with the sign bit $x_{mS}$ may, for example, comprise an exclusive-OR (XOR) gate whose output is applied to the gate of transistor 164 and whose output is further applied to the gate of transistor 160 through a logic inverter.

When the bit line current from the sign bit-cell $14_{mnS}$ is less than the reference current $i_{ref}$, this being indicative of the sign bit-cell $14_{mnS}$ is storing a value for a positive sign, the logic signal at node 174 is logic low, and when the sign bit $x_{mS}$ is also logic low, this being indicative of the remaining bits $x_{mV}$ of the feature (or coefficient) data having a positive sign, the control signal for the current switching circuit output by the XOR gate will be logic low causing the transistor 162 to turn on (and the transistor 160 to turn off). The positive current $i_{BLmP}$ is then sourced to node 166.

When the bit line current from the sign bit-cell $14_{mnS}$ is less than the reference current $i_{ref}$, this being indicative of the sign bit-cell $14_{mnS}$ is storing a value for a positive sign, the logic signal at node 174 is logic low, and when the sign bit $x_{mS}$ is logic high, this being indicative of the remaining bits $x_{mV}$ of the feature (or coefficient) data having a negative sign, the control signal for the current switching circuit output by the XOR gate will be logic high causing the transistor 160 to turn on (and the transistor 162 to turn off). The negative current $i_{BLmN}$ is then sunk from node 166.

When the bit line current from the sign bit-cell $14_{mnS}$ is more than the reference current $i_{ref}$, this being indicative of the sign bit-cell $14_{mnS}$ is storing a value for a negative sign, the logic signal at node 174 is logic high, and when the sign bit $x_{mS}$ is logic low, this being indicative of the remaining bits $x_{mV}$ of the feature (or coefficient) data having a positive sign, the control signal for the current switching circuit output by the XOR gate will be logic high causing the transistor 160 to turn on (and the transistor 162 to turn off). The negative current $i_{BLmN}$ is then sunk from node 166.

When the bit line current from the sign bit-cell $14_{mnS}$ is more than the reference current $i_{ref}$, this being indicative of the sign bit-cell $14_{mnS}$ is storing a value for a negative sign, the logic signal at node 174 is logic high, and when the sign bit $x_{mS}$ is logic high, this being indicative of the remaining bits $x_{mV}$ of the feature (or coefficient) data having a negative sign, the control signal for the current switching circuit output by the XOR gate will be logic low causing the transistor 162 to turn on (and the transistor 160 to turn off). The positive current $i_{BLmP}$ is then sourced to node 166.

The currents sourced to/sunk from the node 166 are applied to an integrator circuit 220. The output voltage for the decision $z_n$ result of the MAC decision operation is generated by the integrator circuit 220 across an integration capacitor Cout. The integrator circuit 220 includes a differential amplifier 222 having an inverting input terminal configured to receive a output reference voltage Vref,out. The integration capacitor Cout is connected in feedback between the output terminal of the amplifier 222 and the non-inverting input terminal. It is the sum of the currents $i_{BL1P}$ (or $i_{BL1N}$), ..., $i_{BLmP}$ (or $i_{BLmN}$) applied to node 166 that is integrated on the output capacitor Cout. A switch formed, for example, by a MOSFET device connected in parallel with the capacitor Cout is selectively activated by reset signal (Reset) to discharge the capacitor Cout at the beginning of each MAC decision operation.

The current mirror circuits $22_1$, ..., $22_m$ in FIGS. 10-1 and 10-2 are shown to have current mirroring ratios of A:B, and A:C, respectively. In an embodiment, B and C may all be equal. In this case, each of the currents $i_{BL1}$, ..., $i_{BLm}$ generated by the current mirror circuits $22_1$, ..., $22_m$ are given equal weight for the integration process. For this implementation, the biasing circuits $20_{1W}$, ..., $20_{mW}$ connected to the current mirror circuits $22_1$, ..., $22_m$ will be driven in response to inputs $v_1$, ..., $v_m$, respectively, as shown in FIG. 10-1.

In an alternative embodiment, however, B and C are not equal. In this case, the currents $i_{BL1}$, $i_{BLm}$ generated by the current mirror circuits $22_1$, $22_m$ are given different weights for the integration process. For example only, in an embodiment supporting binary weighting: B=2, C=1. The currents $i_{BL1}$, $i_{BLm}$ for the integration in this case will be binary weighted. For this implementation, the biasing circuits $20_{1W}$, ..., $20_{mW}$ connected to the current mirror circuits $22_1$, ..., $22_m$ will be driven in response to input $v_m$ as shown in FIG. 10-1.

It will be noted that with the use of the biasing circuit $20_m$ embodiment as shown in FIG. 2D, the current mirror circuit $22_m$ in FIG. 10 may be provided by the current mirror formed by transistors 70, 80 and 82. In other words, transistor 82 would correspond to the output transistor for the current mirror $22_m$. In this implementation, in the event that binary weighting is desired, the current mirroring ratio (A:B, or A:C) would be implemented between transistors 70 and 82 and, as discussed above in connection with FIG. 10-2, the biasing circuits $20_{1W}$, ..., $20_{mW}$ will be driven in response to a common input $v_m$.

Figure 11:
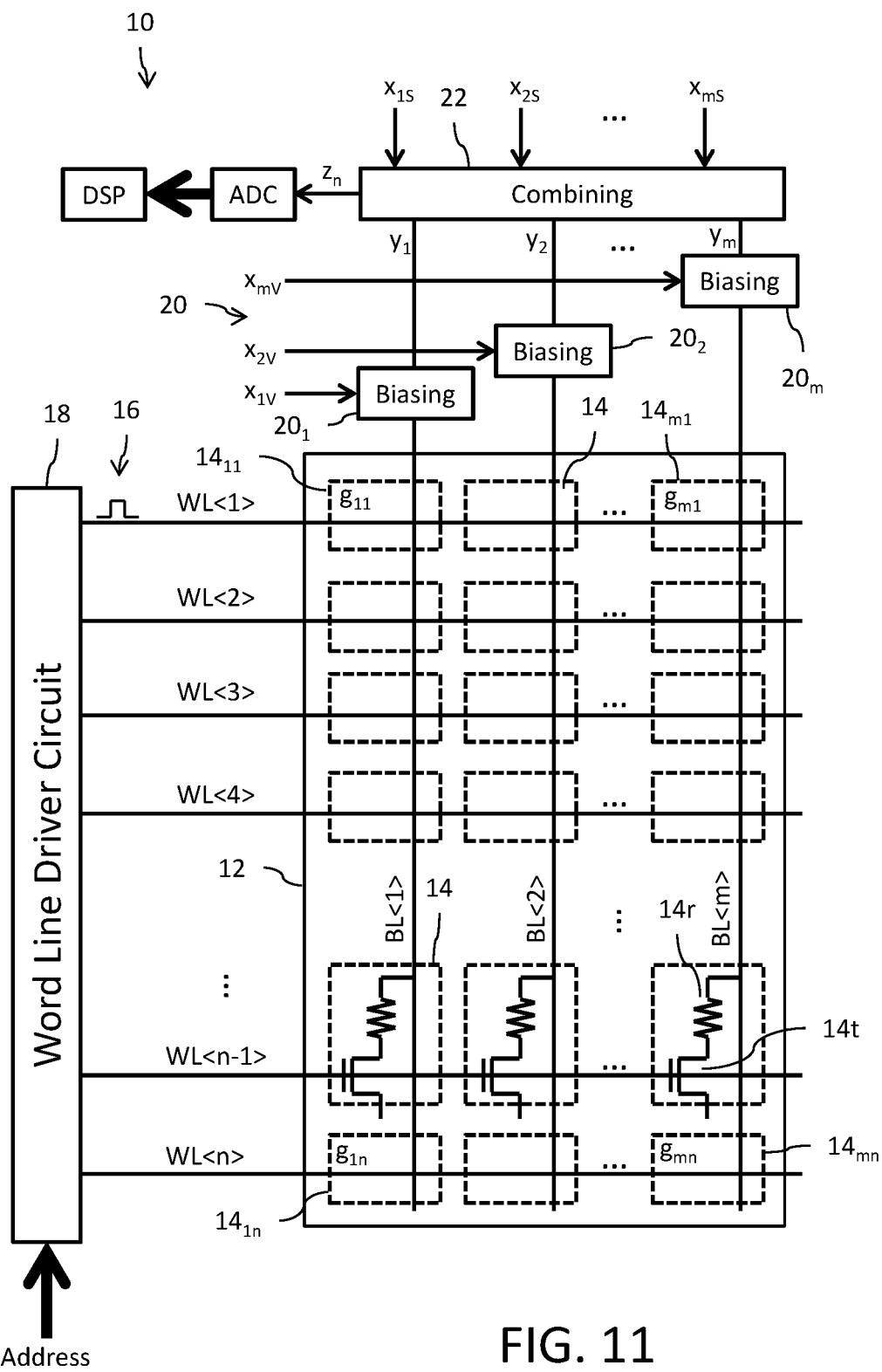
FIG. 11 is a schematic diagram of another embodiment for an in-memory computation circuit.

Reference is now made to FIG. 11 which shows a schematic diagram of a further embodiment for an in-memory computation circuit 10. Like references in FIGS. 1 and 11 refer to like or similar components. The circuit 10 utilizes a memory array 12 formed by a plurality of memory cells 14 arranged in a matrix format having m columns and n rows. Each memory cell 14 is programmed to store data $g_{mn}$ relating to the computational weights for an in-memory compute operation.

Each memory cell 14 includes a word line WL and a bit line BL. The memory cells 14 in a common row of the matrix are connected to each other through a common word line WL. The memory cells 14 in a common column of the matrix are connected to each other through a common bit line BL. The word lines WL<1>, WL<n> are driven by a word line driver circuit 18 which generates word line signals 16 in response to a received address signal (Address). The word line driver circuit 18 decodes the Address and applies the pulse of the word line signal 16 to one word line WL at a time (illustrated here, as an example, as being applied to word line WL<1>). The pulse width of each word line signal 16 is fixed and defined by an on time $T_{ON}$.

It is important to note here that the activation of one word line WL at a time performs a single multiply and accumulate (MAC) operation. In order to perform matrix-vector multiplication (MVM), where k MAC operations are implemented (k being less than or equal to n), a sequence of k word line WL activations are required. Consequently, k word line WL on time (Ton) cycles are necessary for the performance of one full MVM operation.

The circuit of FIG. 11 differs from the circuit of FIG. 1 in that it can also take into account the sign of the plurality of multi-bit digital signals $x_1$, ..., $x_m$ that form the feature data. In this case, consider that one bit $x_{mS}$ of each multi-bit digital signal $x_m$ is reserved for indicating the sign (positive or negative) of the feature data value. This bit $x_{mS}$ is input to the combining circuit 22. The remaining bits $x_{mV}$ of each multi-bit digital signal $x_m$ indicate the value of the feature data and are applied to biasing circuitry 20 as the voltage $v_m$.

The biasing circuitry 20 applies a bias (time, voltage and/or current) to the bit lines BL in response to the remaining bits $x_{mV}$ of the feature (or coefficient) data. The bits xiv, $x_{mV}$ are processed by the biasing circuits $20_1, \ldots, 20_m$ to generate the bias applied to the corresponding word lines WL<1>, . . . , WL<n>. The analog signal $y_m$ on the bit line BL<m>, (i.e., the weight bit line charge) at the column output is then dependent on a product between the bias applied to the bit line and the transconductance (which corresponds to the programmed resistivity) of the memory cell $14_{mn}$ selected by the word line WL to which the word line signal 16 is applied. In other words, the memory cell contributes a bit line current for the analog signal $y_m$ that is proportional to $x_{mV} \times g_{mn}$. So, for an example where the word line signal 16 is applied to word line WL<1>, and the memory cell $14_{11}$ is programmed with the in-memory computation weight, the analog signal $y_1$ current on the bit line BL<1> is proportional to $x_{1V} \times g_{11}$.

The biasing circuits $20_{1W}, \ldots, 20_{mW}$ of the biasing circuitry 20 may have any one of the circuit configurations as shown in FIGS. 2B-2D.

A combining circuit 22 combines, for example through an integration operation, the analog signal $y_1, \ldots, y_m$ currents as a function of the sign bit $x_{mS}$ (which indicates whether the multi-bit digital signal $x_m$ is a positive or negative feature data value), to generate a corresponding decision $z_n$ result for the MAC decision operation, where $z_n = (g_{1n} \times \pm x_{1V}) + (g_{2n} \times \pm x_{2V}) + \ldots + (g_{mn} \times \pm x_{mV})$, and where the $\pm$ symbol indicates the taking into account of whether the feature data is positive or negative. Further processing of the decision $z_n$ result may, for example, be made by converting the analog decision signal $z_n$ to a digital value using an analog-to-digital converter (ADC) which is then processed in a digital signal processing (DSP) circuit.

Figures 1, 12:
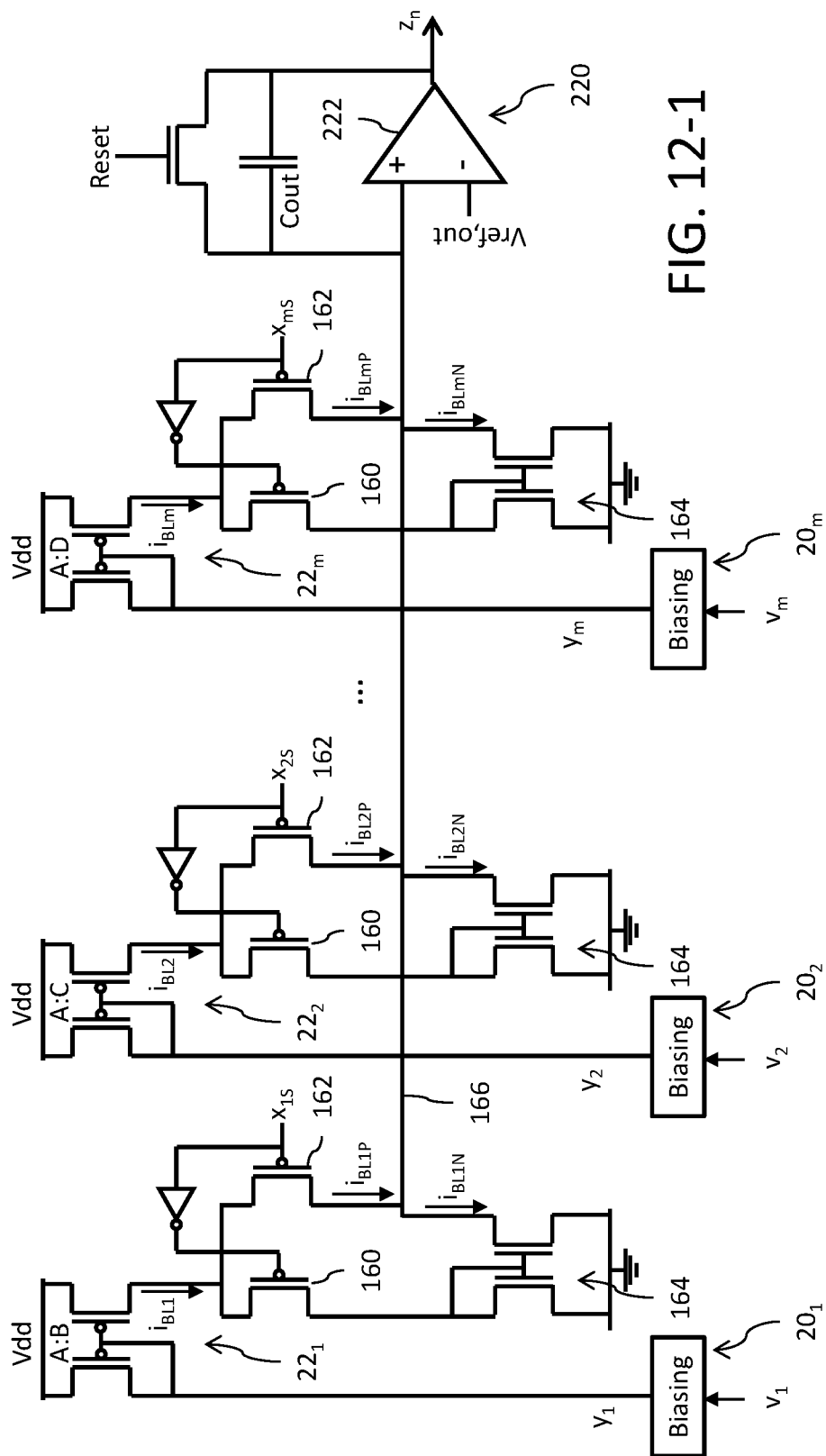
Figures 2, 12:
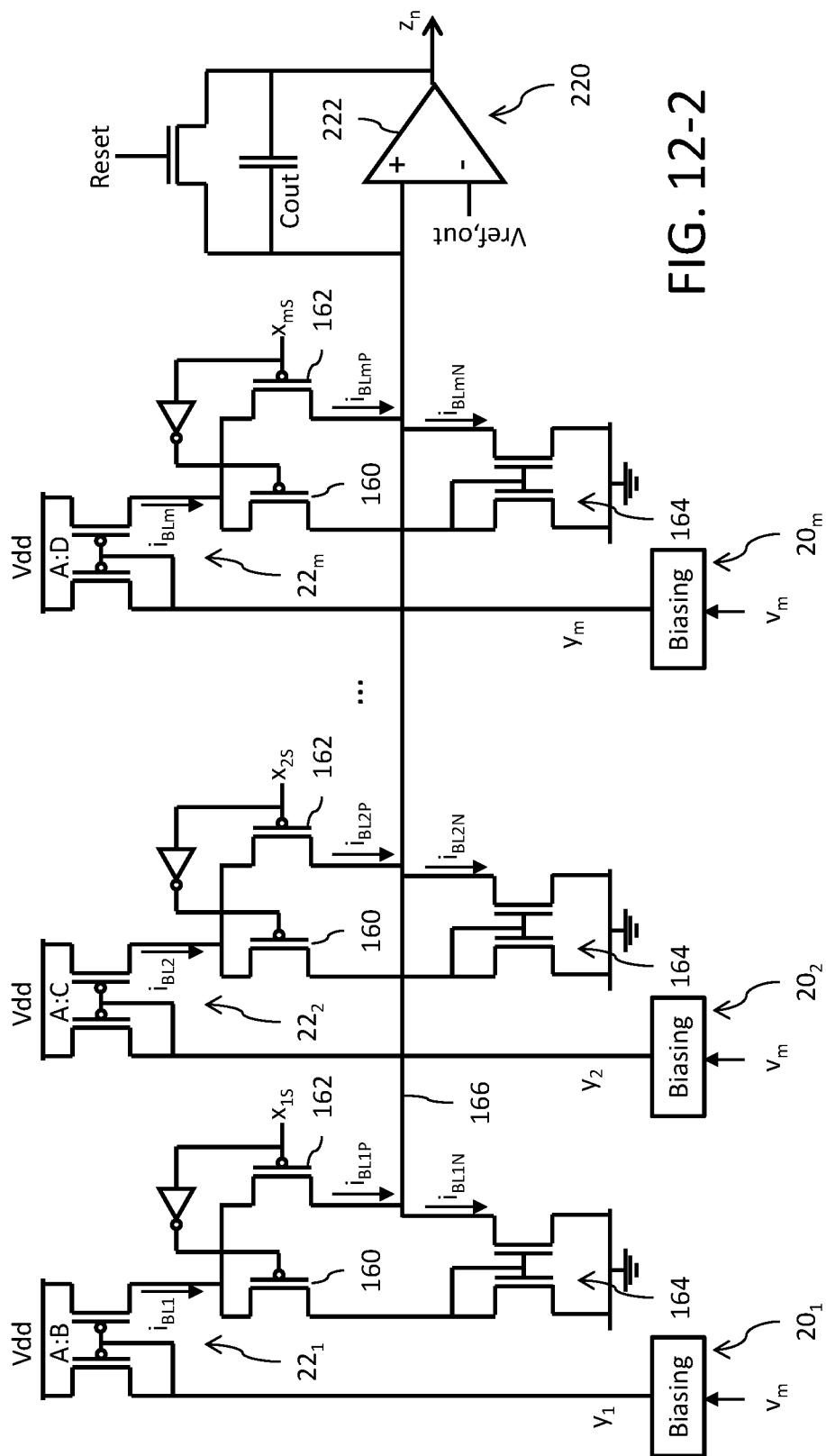

Reference is now made to FIGS. 12-1 and 12-2 which show an embodiment for the combining circuit 22 for use with the implementation of FIG. 11. The analog signal $y_m$ which is the bit line current from the memory cell $14_{mn}$ at the column output is mirrored by a current mirror circuit $22_m$ and sourced as current $i_{BLm}$ to a current switching circuit formed by a pair of MOSFET devices 160, 162. When device 160 is turned on, the current $i_{BLm}$ is inverted by a current mirror circuit 164 and sunk as negative current $i_{BLmN}$ from node 166. Conversely, when device 162 is turned on, the current $i_{BLm}$ is sourced as positive current $i_{BLmP}$ to node 166. The sign bit $x_{mS}$ provides a control signal that is applied to drive the operation of the transistors 160, 162 of the current switching circuit.

When the sign bit $x_{mS}$ is logic low, this being indicative of the remaining bits $x_{mV}$ of the feature (or coefficient) data having a positive sign, the control signal for the current switching circuit will be logic low causing the transistor 162 to turn on (and the transistor 160 to turn off). The positive current $i_{BLmP}$ is then sourced to node 166.

When the sign bit $x_{mS}$ is logic high, this being indicative of the remaining bits $x_{mV}$ of the feature (or coefficient) data having a negative sign, the control signal for the current switching circuit will be logic high causing the transistor 160 to turn on (and the transistor 162 to turn off). The negative current $i_{BLmN}$ is then sunk from node 166.

The currents sourced to/sunk from the node 166 are applied to an integrator circuit 220. The output voltage for the decision $z_n$ result of the MAC decision operation is generated by the integrator circuit 220 across an integration capacitor Cout. The integrator circuit 220 includes a differential amplifier 222 having an inverting input terminal configured to receive a output reference voltage Vref,out. The integration capacitor Cout is connected in feedback between the output terminal of the amplifier 222 and the non-inverting input terminal. It is the sum of the currents $i_{BL1P}$ (or $i_{BL1N}$), . . . , $i_{BLmP}$ (or $i_{BLmN}$) applied to node 166 that is integrated on the output capacitor Cout. A switch formed, for example, by a MOSFET device connected in parallel with the capacitor Cout is selectively activated by reset signal (Reset) to discharge the capacitor Cout at the beginning of each MAC decision operation.

The current mirror circuits $22_1, \ldots, 22_m$ in FIGS. 12-1 and 12-2 are shown to have current mirroring ratios of A:B, A:C and A:D, respectively. In an embodiment, B, C and D may all be equal. In an embodiment, B, C and D may all be equal. In this case, each of the currents $i_{BL1}, i_{BL2}, \ldots, i_{BLm}$ generated by the current mirror circuits $22_1, 22_2, \ldots, 22_m$ are given equal weight for the integration process. For this implementation, the biasing circuits $20_1, \ldots, 20_m$ connected to the current mirror circuits $22_1, \ldots, 22_m$ will be driven in response to inputs $v_1, \ldots, v_m$, respectively, as shown in FIG. 12-1.

In an alternative embodiment, however, B, C and D are not equal. In this case, each of the currents $i_{BL1}, i_{BL2}, \ldots, i_{BLm}$ generated by the current mirror circuits $22_1, 22_2, \ldots, 22_m$ are given different weights for the integration process. For example only, in an embodiment supporting binary weighting: B=4, C=2 and D=1. The currents $i_{BL1}, i_{BL2}, \ldots, i_{BLm}$ for the integration in this case will be binary weighted. For this implementation, the biasing circuits $20_1, \ldots, 20_m$ connected to the current mirror circuits $22_1, \ldots, 22_m$ will be driven in response to input $v_m$ as shown in FIG. 12-2.

It will be noted that with the use of the biasing circuit $20_m$ embodiment as shown in FIG. 2D, the current mirror circuit $22_m$ in FIG. 12 may be provided by the current mirror formed by transistors 70, 80 and 82. In other words, transistor 82 would correspond to the output transistor for the current mirror $22_m$. In this implementation, in the event that binary weighting is desired, the current mirroring ratio (A:B, A:C or A:D) would be implemented between transistors 70 and 82 and, as discussed above in connection with FIG. 12-2, the biasing circuits $20_1, \ldots, 20_m$ will be driven in response to a common input $v_m$.

Figure 13:
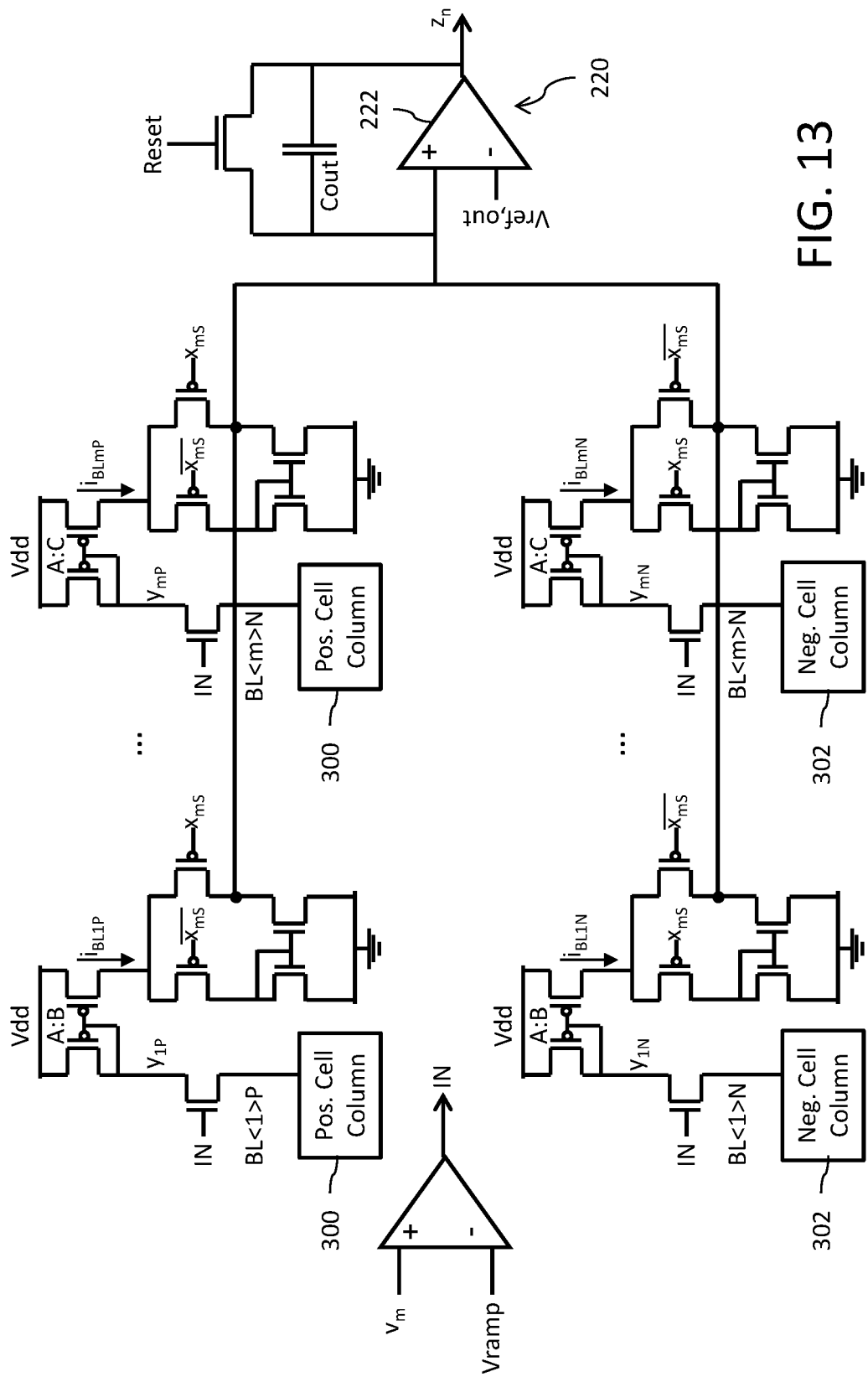
FIG. 13 shows a further embodiment for the combining circuit.

Reference is now made to FIG. 13 which shows a further embodiment for the combining circuit. In this implementation, the array 12 is divided into a positive bank including columns 300 of memory cells 14 storing positive weight data and a negative bank including columns 302 of memory cells 14 storing negative weight data. Although not shown in FIG. 13, it will be understood that each bank may be arranged in the manner of a memory array 12 as shown in FIG. 1 which is accessed through word lines. The configuration of the combining circuit is similar to that shown in FIGS. 12-1 and 12-2 except that there are distinct combining circuits for the bit lines BL<m>P of the positive bank and the bit lines BL<m>N of the positive bank. The currents from the positive bank and the currents from the negative bank are summed and then integrated at the integrator circuit 220 to support signed MAC operations dependent on the sign of the weight data. The inclusion of the current steering circuits in the combining circuits with the positive/negative current steering operation driven by the sign bit $x_{mS}$ supports signed MAC operations dependent on the sign of the feature data. It will be noted that the bias circuits are all driven here in response to the common input $v_m$ in connection with implementation of binary weighting for A:B and A:C.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An in-memory computation circuit, comprising:
a memory array including a plurality of memory cells arranged in a matrix with plural rows and plural columns, the memory cells storing computational weights for an in-memory compute operation, each row including a word line connected to the memory cells of the row, and each column including a bit line connected to the memory cells of the column;
a switching circuit for each bit line, each switching circuit coupled between the bit line and a column output and controlled so that a time duration between turn on and turn off the switching circuit corresponds to a value of coefficient data for said in-memory compute operation;
wherein an analog signal at the column output is dependent on the coefficient data and computational weight;
wherein at least one of the coefficient data and computational weight has a sign; and
a column combining circuit configured to combine and integrate a positive version of said analog signal generated at the column output in response to the sign being positive and combine and integrate a negative version of said analog signal generated at the column output in response to the sign being negative.

2. The in-memory computation circuit of claim 1:
wherein the coefficient data comprises a coefficient sign and a coefficient value; wherein said time duration is controlled in response to the coefficient value; and
wherein said column combining circuit combines and integrates the positive version of said analog signal in response to a positive value of the coefficient sign and combines and integrates the negative version of said analog signal in response to a negative value of the coefficient sign.

3. The in-memory computation circuit of claim 1:
wherein said memory array further includes a plurality of further memory cells arranged in said matrix of plural rows and plural columns, wherein weight signs for the computational weights are stored in the further memory cells, the word line of each row connected to the memory cells and further memory cells of the row, and each column further including a further bit line connected to the further memory cells of the column; and
wherein said column combining circuit combines and integrates the positive version of said analog signal in response to a signal on the further bit line being indicative of a positive value for the weight sign and combines and integrates the negative version of said analog signal in response to said signal on the further bit line being indicative of a negative value of the weight sign.

4. The in-memory computation circuit of claim 3:
wherein the coefficient data comprises a coefficient sign and a coefficient value; wherein said time duration is controlled in response to the coefficient value; and
wherein said column combining circuit combines and integrates the positive version of said analog signal in response to either: a) a positive value of the coefficient sign and the positive value of the weight sign or b) a negative value of the coefficient signal and the negative value of the weight sign; and combines and integrates the negative version of said analog signal in response to either: c) the negative value of the coefficient sign and the positive value of the weight sign or d) the positive value of the coefficient sign and the negative value of the weight sign.

5. The in-memory computation circuit of claim 1:
wherein the memory array includes a first bank of memory cells storing positive computational weights and a second bank of memory cells storing negative computational weights, wherein each column in the first bank includes memory cells connected to a positive bit line and each column in the second bank includes memory cells connected to a negative bit line;
wherein said switching circuit is provided for each positive bit line and negative bit line;
wherein the analog signal at the column output for each positive bit line is dependent on the coefficient data and the positive computational weight;
wherein the analog signal at the column output for each negative bit line is dependent on the coefficient data and the negative computational weight; and
wherein said column combining circuit combines and integrates the positive version of said analog signal from the column output for each positive bit line and combines and integrates the negative version of said analog signal from the column output for each negative bit line.

6. The in-memory computation circuit of claim 5:
wherein the coefficient data comprises a coefficient sign and a coefficient value; wherein said time duration is controlled in response to the coefficient value; and
wherein said column combining circuit a) combines and integrates the positive version of said analog signal from the column output for the positive bit line in response to a positive value of the coefficient sign, b) combines and integrates a negative of the positive version of said analog signal from the column output for the positive bit line in response to a negative value of the coefficient sign, c) combines and integrates the negative version of said analog signal from the column output for the negative bit line in response to a positive value of the coefficient sign, and d) combines and integrates a negative of the negative version of said analog signal from the column output for the negative bit line in response to a negative value of the coefficient sign.

7. The in-memory computation circuit of claim 1, wherein the column combining circuit is configured to apply a binary weighting to the analog signals generated at the column outputs.

8. The in-memory computation circuit of claim 7, wherein the binary weighting is applied using different current mirroring ratios for the analog signals generated at the column outputs.

9. The in-memory computation circuit of claim 1, further comprising means for applying a fixed reference voltage level to each bit line.

10. The in-memory computation circuit of claim 9, wherein the means for applying comprises:
a transistor having a source-drain path connected between the bit line and the column output; and a differential amplifier having an output configured to drive a gate of the transistor, a first input configured to receive a reference voltage and a second input coupled in feedback to the bit line.

11. The in-memory computation circuit of claim 9, wherein the means for applying comprises:
a first transistor having a source-drain path connected between the bit line and the column output;
a second transistor coupled to the first transistor to form a first current mirror circuit; and
a voltage regulator circuit configured to apply said fixed reference voltage level to a source of the second transistor.

12. The in-memory computation circuit of claim 11, further comprising a second current mirror circuit coupled between the first transistor and the second transistor.

13. The in-memory computation circuit of claim 11, wherein the voltage regulator circuit comprises:
a third transistor having a source-drain path connected between the source of the second transistor and a supply reference node; and
a differential amplifier having an output configured to drive a gate of the third transistor, a first input configured to receive a reference voltage and a second input coupled in feedback to the source of the second transistor.

14. The in-memory computation circuit of claim 1, wherein the switching circuit comprises:
a transistor switch coupled between the bit line and the column output; and
a comparator circuit having an output configured to drive a gate of the transistor switch, a first input configured to receive a voltage indicative of the coefficient data and a second input configured to receive a ramp signal.

15. The in-memory computation circuit of claim 14, further comprising a ramp generator circuit configured to generate said ramp signal, wherein the ramp generator circuit operates to generate the ramp signal in response to a reference current generated by a reference memory cell.

16. The in-memory computation circuit of claim 15, wherein the ramp generator circuit comprises:
a transistor having a source-drain path connected in series with a reference bit;
wherein said reference memory cell is connected to the reference bit line;
a differential amplifier having an output configured to drive a gate of the transistor, a first input configured to receive a ramp reference voltage and a second input coupled in feedback to the reference bit line; and
an integration circuit configured to integrate the reference current flowing through the source-drain path of the transistor.

17. The in-memory computation circuit of claim 16, wherein the integration circuit comprises an integration capacitor and further comprising a reset switch actuated to discharge the integration capacitor at a start of each cycle of the ramp signal.

18. D) An in-memory computation circuit, comprising:
a memory array including a plurality of memory cells arranged in a matrix with plural rows and plural columns, wherein each memory cell includes a first bit-cell configured to store a positive computational weight and a second bit-cell configured to store a negative computational weight, each row including a word line connected to the first and second bit-cells for the memory cells of the row, and each column including a positive bit line connected to the first bit-cells of the column and a negative bit line connected to the first bit-cells of the column;
a positive switching circuit for each positive bit line, each positive switching circuit coupled between the positive bit line and a positive column output and controlled so that a time duration between turn on and turn off the switching circuit corresponds to a value of coefficient data for said in-memory compute operation;
wherein a positive analog signal at the positive column output is dependent on the coefficient data and positive computational weight of the first bit-cell;
a negative switching circuit for each negative bit line, each negative switching circuit coupled between the negative bit line and a negative column output and controlled to turn on for said time duration corresponding to coefficient data for said in-memory compute operation;
wherein a negative analog signal at the negative column output is dependent on the coefficient data and negative computational weight of the second bit-cell; and
a column combining circuit configured to add and integrate the positive analog signal generated at the positive column output and subtract and integrate the negative analog signal generated at the negative column output.

19. The in-memory computation circuit of claim 18:
wherein the coefficient data comprises a coefficient sign and a coefficient value; wherein said time duration is controlled in response to the coefficient value; and
wherein said column combining circuit a) adds and integrates the positive analog signal generated at the positive column output if the coefficient sign is positive; b) subtracts and integrates the positive analog signal generated at the positive column output if the coefficient sign is negative; c) subtracts and integrates the negative analog signal generated at the negative column output if the coefficient sign is positive; and d) adds and integrates the negative analog signal generated at the negative column output if the coefficient sign is negative.

20. The in-memory computation circuit of claim 18, wherein the column combining circuit is configured to apply a binary weighting to the analog signals generated at the column outputs.

21. The in-memory computation circuit of claim 20, wherein the binary weighting is applied using different current mirroring ratios for the analog signals generated at the column outputs.

22. The in-memory computation circuit of claim 18, further comprising means for applying a fixed reference voltage level to each bit line.

23. The in-memory computation circuit of claim 18 wherein the switching circuit comprises:
a transistor switch coupled between the bit line and the column output; and
a comparator circuit having an output configured to drive a gate of the transistor switch, a first input configured to receive a voltage indicative of the coefficient data and a second input configured to receive a ramp signal.

24. The in-memory computation circuit of claim 23, further comprising a ramp generator circuit configured to generate said ramp signal, wherein the ramp generator circuit operates to generate the ramp signal in response to a reference current generated by a reference memory cell.

25. The in-memory computation circuit of claim 24, wherein the ramp generator circuit comprises:

a transistor having a source-drain path connected in series with a reference bit;

wherein said reference memory cell is connected to the reference bit line;

a differential amplifier having an output configured to drive a gate of the transistor, a first input configured to receive a ramp reference voltage and a second input coupled in feedback to the reference bit line; and an integration circuit configured to integrate a reference current flowing through the source-drain path of the transistor.

26. The in-memory computation circuit of claim 25, wherein the integration circuit comprises an integration capacitor and further comprising a reset switch actuated to discharge the integration capacitor at a start of each cycle of the ramp signal.

27. D) An in-memory computation circuit, comprising:

a memory array including a plurality of memory cells arranged in a matrix with plural rows and plural columns, wherein each memory cell includes a first bit-cell configured to store a computational weight and a second bit-cell configured to store a weight sign, each row including a word line connected to the first and second bit-cells for the memory cells of the row, and each column including a weight bit line connected to the first bit-cells of the column and a sign bit line connected to the first bit-cells of the column;

a switching circuit for each weight bit line, each switching circuit coupled between the weight bit line and a weight column output and controlled so that a time duration between turn on and turn off the switching circuit corresponds to a value of coefficient data for said in-memory compute operation;

wherein an analog signal at the weight column output is dependent on the coefficient data and computational weight; and a column combining circuit configured to add and integrate the analog signal generated at the weight column output in response to a signal on the sign bit line indicating a positive value for the weight sign and subtract and integrate the analog signal generated at the weight column output in response to a signal on the sign bit line indicating a negative value for the weight sign.

28. The in-memory computation circuit of claim 27:

wherein the coefficient data comprises a coefficient sign and a coefficient value; wherein said time duration is controlled in response to the coefficient value; and wherein said column combining circuit a) adds and integrates the analog signal generated at the weight column output if the coefficient sign is positive and the weight sign has the positive value; and b) subtracts and integrates the analog signal generated at the weight column output if the coefficient sign is negative and the weight sign has the positive value; c) subtracts and integrates the analog signal generated at the weight column output if the coefficient sign is positive and the weight sign has the negative value; and d) adds and integrates the analog signal generated at the weight column output if the coefficient sign is negative and the weight sign has the negative value.

29. The in-memory computation circuit of claim 28, wherein the column combining circuit is configured to apply a binary weighting to the analog signals generated at the column outputs.

30. The in-memory computation circuit of claim 29, wherein the binary weighting is applied using different current mirroring ratios for the analog signals generated at the column outputs.

31. The in-memory computation circuit of claim 27, further comprising means for applying a fixed reference voltage level to each bit line.

32. The in-memory computation circuit of claim 27, wherein the switching circuit comprises:

a transistor switch coupled between the bit line and the column output; and a comparator circuit having an output configured to drive a gate of the transistor switch, a first input configured to receive a voltage indicative of the coefficient data and a second input configured to receive a ramp signal.

33. The in-memory computation circuit of claim 32, further comprising a ramp generator circuit configured to generate said ramp signal, wherein the ramp generator circuit operates to generate the ramp signal in response to a reference current generated by a reference memory cell.

34. The in-memory computation circuit of claim 33, wherein the ramp generator circuit comprises:

a transistor having a source-drain path connected in series with a reference bit;

wherein said reference memory cell is connected to the reference bit line;

a differential amplifier having an output configured to drive a gate of the transistor, a first input configured to receive a ramp reference voltage and a second input coupled in feedback to the reference bit line; and an integration circuit configured to integrate a reference current flowing through the source-drain path of the transistor.

35. The in-memory computation circuit of claim 34, wherein the integration circuit comprises an integration capacitor and further comprising a reset switch actuated to discharge the integration capacitor at a start of each cycle of the ramp signal.

36. An in-memory computation circuit, comprising:

a memory array including a plurality of memory cells arranged in a matrix with plural rows and plural columns, wherein each memory cell is configured to store a computational weight, each row including a word line connected to the memory cells of the row, and each column including a bit line connected to the memory cells of the column;

a switching circuit for each bit line, each switching circuit coupled between the bit line and a column output and controlled so that a time duration between turn on and turn off the switching circuit corresponds to a value of coefficient data for said in-memory compute operation;

wherein an analog signal at the column output is dependent on the coefficient data and computational weight;

wherein the coefficient data comprises a coefficient sign and a coefficient value; and a column combining circuit configured to add and integrate the analog signal generated at the column output in response to a positive value of the coefficient sign and subtract and integrate the analog signal generated at the column output in response to a negative value of the coefficient sign.

37. The in-memory computation circuit of claim 36, wherein the column combining circuit is configured to apply a binary weighting to the analog signals generated at the column outputs.

38. The in-memory computation circuit of claim 37, wherein the binary weighting is applied using different current mirroring ratios for the analog signals generated at the column outputs.

39. The in-memory computation circuit of claim 36, further comprising means for applying a fixed reference voltage level to each bit line.

40. The in-memory computation circuit of claim 36, wherein the switching circuit comprises:
a transistor switch coupled between the bit line and the column output; and
a comparator circuit having an output configured to drive a gate of the transistor switch, a first input configured to receive a voltage indicative of the coefficient data and a second input configured to receive a ramp signal.

41. The in-memory computation circuit of claim 40, further comprising a ramp generator circuit configured to generate said ramp signal, wherein the ramp generator circuit operates to generate the ramp signal in response to a reference current generated by a reference memory cell.

42. The in-memory computation circuit of claim 41, wherein the ramp generator circuit comprises:
a transistor having a source-drain path connected in series with a reference bit;
wherein said reference memory cell is connected to the reference bit line;
a differential amplifier having an output configured to drive a gate of the transistor, a first input configured to receive a ramp reference voltage and a second input coupled in feedback to the reference bit line; and
an integration circuit configured to integrate the reference current flowing through the source-drain path of the transistor.

43. The in-memory computation circuit of claim 42, wherein the integration circuit comprises an integration capacitor and further comprising a reset switch actuated to discharge the integration capacitor at a start of each cycle of the ramp signal.

44. D) An in-memory computation circuit, comprising:
a memory array including a first bank of a plurality of memory cells arranged in a matrix with plural rows and plural columns, wherein each memory cell of the first bank is configured to store a positive computational weight, and a second bank of a plurality of memory cells arranged in a matrix with plural rows and plural columns, wherein each memory cell of the second bank is configured to store a negative computational weight, each row including a word line connected to the memory cells of the first and second banks, and each column including a positive bit line connected to the memory cells of the column in the first bank and a negative bit line connected to the memory cells of the column in the second bank;
a positive switching circuit for each positive bit line, each positive switching circuit coupled between the positive bit line and a positive column output and controlled so that a time duration between turn on and turn off the switching circuit corresponds to a value of coefficient data for said in-memory compute operation;
wherein a positive analog signal at the positive column output is dependent on the coefficient data and positive computational weight of the first bit-cell;
a negative switching circuit for each negative bit line, each negative switching circuit coupled between the negative bit line and a negative column output and controlled so that a time duration between turn on and turn off the switching circuit corresponds to the value of coefficient data for said in-memory compute operation;
wherein a negative analog signal at the negative column output is dependent on the coefficient data and negative computational weight of the second bit-cell; and
a column combining circuit configured to add and integrate the positive analog signal generated at the positive column output and subtract and integrate the negative analog signal generated at the negative column output.

45. The in-memory computation circuit of claim 44:
wherein the coefficient data comprises a coefficient sign and a coefficient value; wherein said time duration is controlled in response to the coefficient value; and
wherein said column combining circuit a) adds and integrates the positive analog signal generated at the positive column output if the coefficient sign is positive; b) subtracts and integrates the positive analog signal generated at the positive column output if the coefficient sign is negative; c) subtracts and integrates the negative analog signal generated at the negative column output if the coefficient sign is positive; and d) adds and integrates the negative analog signal generated at the negative column output if the coefficient sign is negative.

46. The in-memory computation circuit of claim 44, wherein the column combining circuit is configured to apply a binary weighting to the analog signals generated at the column outputs.

47. The in-memory computation circuit of claim 46, wherein the binary weighting is applied using different current mirroring ratios for the analog signals generated at the column outputs.

48. The in-memory computation circuit of claim 44, further comprising means for applying a fixed reference voltage level to each bit line.

49. The in-memory computation circuit of claim 44, wherein the switching circuit comprises:
a transistor switch coupled between the bit line and the column output; and
a comparator circuit having an output configured to drive a gate of the transistor switch, a first input configured to receive a voltage indicative of the coefficient data and a second input configured to receive a ramp signal.

50. The in-memory computation circuit of claim 49, further comprising a ramp generator circuit configured to generate said ramp signal, wherein the ramp generator circuit operates to generate the ramp signal in response to a reference current generated by a reference memory cell.

51. The in-memory computation circuit of claim 50, wherein the ramp generator circuit comprises:
a transistor having a source-drain path connected in series with a reference bit;
wherein said reference memory cell is connected to the reference bit line;
a differential amplifier having an output configured to drive a gate of the transistor, a first input configured to receive a ramp reference voltage and a second input coupled in feedback to the reference bit line; and
an integration circuit configured to integrate a reference current flowing through the source-drain path of the transistor.

52. The in-memory computation circuit of claim 51, wherein the integration circuit comprises an integration capacitor and further comprising a reset switch actuated to discharge the integration capacitor at a start of each cycle of the ramp signal.

\* \* \* \* \*